(12) United States Patent
Masuda

(10) Patent No.: US 7,091,757 B2
(45) Date of Patent: Aug. 15, 2006

(54) FREQUENCY GENERATOR AND COMMUNICATION SYSTEM

(75) Inventor: Toru Masuda, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/893,438

(22) Filed: Jul. 19, 2004

(65) Prior Publication Data

US 2005/0077930 A1    Apr. 14, 2005

(30) Foreign Application Priority Data

Oct. 8, 2003    (JP) .............................. 2003-349010

(51) Int. Cl.
*H03B 19/00*    (2006.01)
*H03B 21/00*    (2006.01)

(52) U.S. Cl. ..................... 327/122; 327/119; 327/113

(58) Field of Classification Search ........ 327/113–116, 327/119, 122
See application file for complete search history.

(56) References Cited

U.S. PATENT DOCUMENTS 5,011,561 A * 4/1991 Carolus et al. ............. 156/495
5,297,179 A    3/1994 Tatsumi ....................... 377/47
5,389,886 A * 2/1995 Popescu ...................... 327/120
6,229,359 B1 * 5/2001 Chesavage .................. 327/116

FOREIGN PATENT DOCUMENTS

| JP | 4-329710 | 11/1992 |
| JP | 7-115325 | 5/1995 |
| JP | 2000-68744 | 3/2000 |

* cited by examiner

*Primary Examiner*—Dinh T. Le
(74) *Attorney, Agent, or Firm*—Miles & Stockbridge P.C.

(57) ABSTRACT

The object of the invention is to provide a frequency generator which is composed of an oscillator and a frequency doubler and in which difference in amplitude between differential outputs of the frequency doubler can be equalized at low power consumption without adjustment. To achieve the object, the amplitude of differential outputs of the frequency doubler is detected and the delay time of a variable delay circuit is controlled. Owing to this configuration, in case a frequency of the oscillator varies or in case delay time by the delay circuit used in the frequency doubler varies by process variation and others even if the frequency is fixed, the amplitude of the differential outputs of the frequency doubler can be also equalized in the frequency generator.

19 Claims, 17 Drawing Sheets

FREQUENCY GENERATOR AND COMMUNICATION SYSTEM

CLAIM OF PRIORITY

The present application claims priority from Japanese application serial no. JP 2003-349010, field on Oct. 8, 2003, the content of which is hereby incorporated by reference into this application.

BACKGROUND OF THE INVENTION

1. Field of the Invention

The present invention relates to a frequency generator provided with an oscillator and a frequency doubler that doubles its output frequency and a communication system.

2. Description of the Prior Art

FIG. 4 is a block diagram showing a frequency generator using a frequency doubler 50 showing a first conventional type example. In a voltage controlled oscillator (VCO) 2, the oscillation frequencies of its differential output signals 101, 102 are controlled by voltage applied to a frequency control terminal 1. The differential output signals 101 and 102 are branched in two and are input to a Gilbert-type multiplier 6 via a delay circuit (DLY) 4a and a delay circuit 4b. Signals 113, 114 via the delay circuit 4B are input to the bases of transistors Q1 and Q2 and signals 111 and 112 via the delay circuit 4A are input to the bases of transistors Q3 to Q6.

Current flowing at a connector common terminal of the transistors Q3 and Q5 is converted to voltage by a load 10 and emerges at a node 103 as a voltage signal. Similarly, current flowing at a connector common terminal of the transistors Q4 and Q6 is converted to a voltage output signal 104 by a load 11. The voltage output signals 103 and 104 are input to a differential amplifier 5 and output signals 105 and 106 are acquired. The delay time TdA of the delay circuit 4A and the delay time TdB of the delay circuit 4B are determined so that the Gilbert-type multiplier 6 executes doubling operation.

The frequency multiplying operation of the circuit shown in FIG. 4 will be described below. Delay time difference (TdA−TdB) is made between input voltage from the transistor Q1 to the base terminal of the transistor Q2 in the Gilbert-type multiplier 6 and input voltage from the transistor Q3 to the base terminal of the transistor Q6 similarly. Time at which a collector current pulse from the transistor Q3 to the transistor Q6 is generated is determined by the time difference. In a T/4 cycle (T: a cycle of an input signal), the pulse width of synthetic current of the transistors Q3 and Q5 and the pulse width of synthetic current of the transistors Q4 and Q6 are equal. These output currents are converted to voltage in the loads 10, 11 and voltage pulse signals of a double frequency are output from terminals 105, 106 via the differential amplifier 5. For a conventional type example of a frequency doubler using the Gilbert-type multiplier, FIG. 11 shown in a patent document 1 can be given.

For a second conventional type example, in a patent document 2, a frequency doubler that can automatically adjust the duty ratio of an output signal and can be formed by a digital circuit is disclosed. The frequency doubler is composed of a variable delay circuit 72, an exclusive OR gate 73, allow pass filter (LPF) 74 and an integrator 75 as shown in FIG. 17. The exclusive OR gate 73 exclusive-ORs an input signal Vin and a signal delayed in the variable delay circuit 72 and outputs a frequency doubled signal. The low pass filter 74 filters the frequency doubled signal of a lower frequency and outputs its mean voltage. The integrator 75 integrates voltage difference between the output voltage of the low pass filter 74 and reference voltage input to a terminal 76. The delay time of the variable delay circuit 72 is controlled and a frequency doubled signal of desired duty can be acquired by feeding back the output of the integrator 75 to the variable delay circuit 72.

[Patent document 1]

JP-A-2000-68744 (FIG. 11)

[Patent document 2]

JP-A-4-329710 (FIG. 1)

SUMMARY OF THE INVENTION

However, according to the first conventional type example shown in FIG. 4, delay time difference between the delay circuits 4A and 4B forming the frequency doubler 50 may be not a T/4 cycle for the cycle T of an input signal and a problem occurs in circuit operation. For example, the dispersion of components forming the circuit occurs. In case a circuit is formed by individual components, delay time difference is different from a desired value by the dispersion of technique for connection such as soldering and bonding, and in case a circuit is formed by an integrated circuit, delay time difference is different from a desired value by the manufacturing dispersion of on-chip devices and elements such as a transistor, a resistor and a capacitor used for a delay circuit.

Besides, depending upon environment in which a frequency generator is used, that is, depending upon the variation of temperature and power supply voltage, delay time difference varies from a desired value. In case an LC resonant oscillator the oscillation frequency of which is not influenced by the variation of temperature and power supply voltage is used for an oscillator, an input frequency of a frequency doubler can be kept fixed, however, delay time between delay circuits may vary.

Further, an oscillator is provided with a control parameter such as voltage and current and the oscillation frequency of an output signal is required to be varied by these parameters. Therefore, in case delay time difference is set to one fixed value, a single frequency at which the delay time difference is a T/4 cycle exists, however, the value is not a desired value for an oscillation frequency except it.

In case delay time difference between delay circuits in a frequency doubler is not a T/4 cycle for the cycle T of an input signal, it is difficult to adjust the duty ratio of a signal to 50% for example in differential outputs 105, 106 of the frequency doubler 50.

In a high-frequency region in which an oscillation frequency is a few GHz or more, in any case in which a frequency generator is formed by individual components or an integrated circuit, analog operation in which output amplitude is not constantly fixed is performed for a limit of the performance of the velocity of a parasitic element and a transistor used for a circuit. Therefore, in case delay time difference between the delay circuits 4A and 4B of the frequency doubler 50 is not a T/4 cycle, difference is made in amplitude between differential outputs.

Therefore, in case a frequency generator in which delay time difference between the delay circuits of the frequency doubler 50 is not a desired value is actually used, many differential circuits are required to be cascaded to equalize output amplitude and amplitude is required to be saturated (limited) in a signal path. In FIG. 4, a differential amplifier for saturating amplitude (SAT) 30 provided to terminals of output signals 105, 106 plays the role. To saturate in a high frequency, the time constant of a load is required to be reduced and output impedance is required to be reduced. Therefore, a problem that consumed current increases and large power consumption is caused occurs.

Besides, in a frequency generator using the frequency doubler in the first conventional type example, circuit operation depending upon the duty of a signal is performed and in case its value is 50%, delay time difference is required to be reset. In that case, the trial of the circuit is required to be repeated.

As described above, in case the output frequency of an oscillator varies, delay time difference is required to be suitably adjusted. The case that the two delay circuits 4A and 4B are simultaneously arranged has been described based upon the circuit configuration shown in FIG. 4, however, even if only the delay circuit 4A is arranged or even if only the delay circuit 4B is arranged, the above-mentioned problem occurs.

In the second conventional type example shown in FIG. 17, the circuit is formed by a digital circuit and the analog operation of the circuit for generating a frequency doubled wave by exclusive-OR, that is, operation when the amplitude and the mean value of an output signal depending upon the delay time of the variable delay circuit 72 vary in case a high-frequency signal is input vary is also not compensated.

The invention is made to solve the above-mentioned problems and the main object is to provide a frequency generator in which the adjustment of the amplitude of differential output by the differential amplifier for saturating amplitude 30 formed by the cascade connection of differential circuits as in the first conventional type example is not required and which is operated with small power even if the oscillation frequency of an oscillator is a few GHz or more and is a high frequency.

Besides, one of the objects of the invention is to provide a frequency doubler suitable for the frequency generator.

Further, one of the objects of the invention is to provide a communication system using the frequency generator.

To achieve the objects, the frequency generator according to the invention is characterized as follows.

(1) The frequency generator according to the invention is based upon a frequency generator provided with an oscillator that outputs a differential signal which can control an oscillation frequency and a frequency doubler to which a differential signal output from the oscillator is input, which doubles the frequency of the input signal and outputs a differential signal, and is characterized in that the frequency doubler is provided with a variable delay circuit, a differential multiplier provided with a first differential input terminal to which the differential output signal of the oscillator is input via the variable delay circuit and a second differential input terminal to which the differential output signal of the oscillator is input, a voltage-swing detection circuit that detects each magnitude of the amplitude of a positive phase and a negative phase of differential outputs of the differential multiplier and a control circuit that controls the delay time of the variable delay circuit based upon amplitude difference detected by the voltage-swing detection circuit and the differential outputs of the differential multiplier are the output of the frequency generator. In this case, the oscillator has only to be an oscillator that outputs a differential signal which can control the oscillation frequency by voltage or current applied to a frequency control terminal.

(2) In the frequency generator described in above (1), a 1:2 frequency divider to which the differential outputs of the differential multiplier are input, which divides the frequency of an input signal in two, separates it into angular frequencies 0, π/2, π, 3/2π [rad/sec] and outputs four differential output signals may be further provided.

(3) In the frequency generator described in above (1) or (2), the control circuit may also control the delay time of the variable delay circuit so that each magnitude of the amplitude of the positive phase and the negative phase is equal or may also control the delay time of the variable delay circuit so that fixed difference is made in each magnitude of the amplitude of the positive phase and the negative phase and the duty of the differential outputs of the differential multiplier is a predetermined value.

(4) In the frequency generator described in above (1) to (3), it is desirable that the differential multiplier includes a Gilbert-type multiplier.

(5) In the frequency generator described in above (1), the variable delay circuit is a circuit that outputs differential signals acquired by adding delay time according to voltage applied to the control terminal to the differential input signals, the differential multiplier is a Gilbert-type multiplier, the differential output current of the Gilbert-type multiplier is extracted as differential output-voltage signals by load circuits that convert to voltage and output, the voltage-swing detection circuit is a circuit that detects and outputs respective lower limit values of a positive phase and a negative phase of the differential output-voltage signals of the load circuits, and it is desirable that the control circuit is formed by an error amplifier to which differential output voltage between respective lower limit values of a positive phase and a negative phase of the voltage-swing detection circuit is input, which converts the amplitude in voltage of a positive phase and a negative phase of the differential outputs of the load circuits so that the amplitude is predetermined magnitude and outputs it to a control terminal of the variable delay circuit.

(6) In the frequency generator described in above (5), first and second differential amplifiers to which the differential output-voltage signals of the load circuits are input are further provided, the differential output of the first differential amplifier may be also input to the voltage-swing detection circuit and the differential output of the second differential amplifier may be also input to the output terminal of the frequency generator.

(7) In the frequency generator described in above (6), a band-pass filter provided with the highest frequency band-pass characteristic for a double frequency of a frequency output from the oscillator can be also provided between the outputs of the load circuits and the differential inputs of the first and second differential amplifiers.

(8) The frequency generator according to the invention is based upon a frequency generator provided with an oscillator that outputs differential signals which can control an oscillation frequency and a frequency doubler to which the differential signals output from the oscillator are input, which doubles frequencies of the input signals and outputs differential signals, and is characterized in that the frequency doubler is provided with a variable delay circuit, a Gilbert-type multiplier provided with a first differential input terminal to which the differential output signal of the oscillator is input via the variable delay circuit and a second differential input terminal to which the differential output signal of the oscillator is input and that outputs current acquired by multiplying the input signals, load circuits that have the highest frequency bandpass characteristic for a double frequency of a frequency of the oscillator, convert current output from the Gilbert-type multiplier to differential output-voltage signals and outputs them, a DC decoupling circuit to which the differential outputs of the load circuits are input and which removes respective DC components, a voltage-swing detection circuit to which the differential outputs of the DC decoupling circuit are input and which detects each magnitude of the amplitude of a positive phase and a negative phase and a control circuit that controls the delay time of the variable delay circuit based upon difference in amplitude between the positive phase and the negative phase detected by the voltage-swing detection circuit and the differential outputs of the Gilbert-type multiplier are the differential outputs of the frequency generator. To provide the bandpass characteristic to the load circuits, the load circuits have only to be formed by an LC resonant circuit.

(9) In the frequency generator described in above (8), a band-pass filter provided with the highest frequency bandpass characteristic for a double frequency of a frequency output from the oscillator is further provided between the DC decoupling circuit and the voltage-swing detection circuit in place of providing the highest frequency bandpass characteristic for the double frequency of the frequency output from the oscillator to the load circuits, and the voltage-swing detection circuit may also detect each magnitude of the amplitude of differential outputs of the bandpass filter. In this case, the load circuits are not formed by an LC resonant circuit and have only to be formed by a resistance load.

(10) The Gilbert-type multiplier in any of the frequency generators described in above (4) to (9) is provided with first and second transistors the respective emitters of which are connected in common, third and fourth transistors the respective emitters of which are connected in common, fifth and sixth transistors the respective emitters of which are connected in common and a first current source, the collector of the first transistor is connected to the common emitter of the third and fourth transistors, the collector of the second transistor is connected to the common emitter of the fifth and sixth transistors, the common emitter of the first and second transistors is connected to a first constant-voltage terminal via the first current source, the collector of the third transistor is connected to the collector of the fifth transistor to be a first output terminal, the collector of the fourth transistor is connected to the collector of the sixth transistor to be a second output terminal, first differential input terminals are composed of the base of the first transistor to which a signal of a positive phase is input and the base of the second transistor to which a signal of a negative phase is input, and second differential input terminals are composed of the bases of the third and sixth transistors to which a signal of a positive phase is input and the bases of the fourth and fifth transistors to which a signal of a negative phase is input.

(11) Seventh and eighth transistors the bases of which are connected in common and which are connected to a third constant-voltage terminal are further provided to the Gilbert-type multiplier described in above (10), the emitter of the seventh transistor is connected to the collectors of the third and fifth transistors, the emitter of the eighth transistor is connected to the collectors of the fourth and sixth transistors, the collector of the seventh transistor may also function as the first output terminal in place of the collectors of the third and fifth transistors, and the collector of the eighth transistor may also function as the second output terminal in place of the collectors of the fourth and sixth transistors.

(12) The first to sixth transistors in the Gilbert-type multiplier described in above (10) are replaced with first to sixth N-type MOS transistors, the source may also function as the emitter, the drain may also function as the collector, and the gate may also function as the base.

(13) The first to eighth transistors in the Gilbert-type multiplier described in above (11) are replaced with first to eighth N-type MOS transistors, the source may also function as the emitter, the drain may also function as the collector, and the gate may also function as the base.

(14) Any variable delay circuit of the frequency generators described in above (1) to (13) is provided with ninth to nineteenth transistors and first to seventh resistors, the emitters of the ninth and tenth transistors are connected in common, the collector of the ninth transistor is connected to a first constant-voltage terminal via the first resistor, the collector of the tenth transistor is connected to the first constant-voltage terminal via the second resistor, the collector of the eleventh transistor is connected to the common emitter of the ninth and tenth transistors, the emitter of the eleventh transistor is connected to a second constant-voltage terminal via the third resistor, the base of the eleventh transistor is connected to a third constant-voltage terminal, the base of the twelfth transistor is connected to a connection of the first resistor and the collector of the ninth transistor, the emitter of the twelfth transistor is connected to the collector of the thirteenth transistor and the base of the fourteenth transistor, the collector of the twelfth transistor is connected to the first constant-voltage terminal, the emitter of the thirteenth transistor is connected to the second constant-voltage terminal via the fourth resistor, the collector of the fourteenth transistor is connected to the first constant-voltage terminal, the emitter of the fourteenth transistor is connected to the collector of the fifteenth transistor, the emitter of the fifteenth transistor is connected to the second constant-voltage terminal via the fifth resistor, the base of the sixteenth transistor is connected to a connection of the second resistor and the collector of the tenth transistor, the emitter of the sixteenth transistor is connected to the collector of the seventeenth transistor and the base of the eighteenth transistor, the collector of the sixteenth transistor is connected to the first constant-voltage terminal, the emitter of the seventeenth transistor is connected to the second constant-voltage terminal via the sixth resistor, the collector of the eighteenth transistor is connected to the first constant-voltage terminal, the emitter of the eighteenth transistor is connected to the collector of the nineteenth transistor, the emitter of the nineteenth transistor is connected to the second constant-voltage terminal via the seventh resistor, the base of the ninth transistor functions as an input terminal of an input signal of a positive phase, the base of the tenth transistor functions as an input terminal of an input signal of a negative phase, the emitter of the eighteenth transistor functions as an input terminal of an output signal of a positive phase, the emitter of the fourteenth transistor functions as an input terminal of an output signal of a negative phase, and the bases of the thirteenth, fifteenth, seventeenth and nineteenth transistors function as a delay time control terminal.

(15) In the variable delay circuit described in above (14), as shown in FIG. 11, the bases of the thirteenth, fifteenth, seventeenth and nineteenth transistors are connected to the third constant-voltage terminal in place of the delay time control terminal, the base of the eleventh transistor is connected to the delay time control terminal in place of the third constant-voltage terminal, further, an amplitude limiter provided with differential input/output terminals is provided, the emitters of the eighteenth and fourteenth transistors of the variable delay circuit are connected the differential input terminal of the amplitude limiter, and the differential output terminal of the amplitude limiter may also function as an output terminal of a positive phase and an output terminal of a negative phase.

(16) The voltage-swing detection circuit described in above (8) or (9) is a transistor which is provided with two first voltage-swing detection basic circuits for detecting maximum voltage and in which the collector of the first voltage-swing detection basic circuit is connected to a first constant-voltage terminal as shown in FIG. 13 and the emitter is connected to a second constant-voltage terminal via a first capacitor, and it is desirable that the transistor the base of which functions as an input terminal and the emitter of which functions as an output terminal and a first switch provided with a function for discharging charge stored in the first capacitor to the second constant-voltage terminal according to a signal input to a reset terminal are provided between both terminals of the first capacitor.

(17) The voltage-swing detection circuit described in above (5) to (9) is a transistor which is provided with two second voltage-swing detection basic circuits for detecting minimum voltage and in which the collectors of the second voltage-swing detection basic circuits are connected to a terminal (a first terminal) of the second capacitor and are connected to a first constant-voltage terminal as shown in FIG. 12 and the emitters are connected to the cathode of a first diode and are connected to a second constant-voltage terminal via a current source, and it is desirable that the transistor the base of which functions as an input terminal, is connected to the anode of the first diode the other terminal (a second terminal) of the second capacitor and further, a second switch provided with a function for discharging charge stored in the second capacitor to the second constant-voltage terminal according to a signal input to a reset terminal are provided between both terminals of the second capacitor.

(18) An optical communication system according to the invention is based upon an optical transmission system provided with a multiplexer to which plural parallel data signals and a clock are input and which multiplexes the parallel data signals to a serial data signal, a driver that amplifies the serial data signal, a laser oscillator that generates an optical signal, a modulator that outputs an optical modulated signal acquired by modulating the optical signal according to a modulating signal output from the driver, an optical fiber for transmitting the optical modulated signal, a photodetector that converts the optical modulated signal received via the optical fiber to a current signal, an amplifier that converts the current signal to a voltage signal and a demultiplexer that demultiplexes the serial data signal to parallel data signals, and is characterized in that the multiplexer includes a multiplexer core that multiplexes an input data signal, a clock control circuit and a frequency generator that provides a reference clock of the multiplexer core, the demultiplexer includes a demultiplexer core that demultiplexes the input data signal, a clock extractor and a frequency generator that provides a reference clock of the demultiplexer core and at least one of the frequency generator inside the multiplexer and the frequency generator inside the demultiplexer includes the frequency generator described in any of above (1) to (17).

(19) A radio communication system according to the invention is based upon a radio receiving system provided with an antenna that receives a radio signal, a first low noise amplifier that amplifies the output of the antenna, a frequency generator controlled by a baseband circuit, a mixer that mixes a frequency of the output of the first low noise amplifier and a frequency of the output of the frequency generator, a band-pass filter that selects the output of the mixer limiting a frequency band, an IF amplifier that amplifies the output of the band-pass filter and a demodulator that demodulates the output of the IF amplifier, extracts the modulating signal and applies it to the baseband circuit, and is characterized in that the frequency generator includes the frequency generator described in any of above (1) to (17).

(20) Besides, a radio communication system according to the invention is based upon a radio receiving system provided with an antenna that receives a radio signal, a first low noise amplifier that amplifies the output of the antenna, a frequency generator that is controlled by a baseband circuit and generates two signals different in a phase by $\pi/2$ [rad/sec], a first mixer that mixes a frequency of the output of a first phase of the first low noise amplifier and a frequency of the output of the first phase of the frequency generator, a first band-pass filter that selects the output of the first mixer limiting a frequency band, a first IF amplifier that amplifies the output of the first band-pass filter, a second mixer that mixes a frequency of the output of a second phase of the first low noise amplifier and a frequency of the output of the second phase of the frequency generator, a second band-pass filter that selects the output of the second mixer limiting a frequency band, a second IF amplifier that amplifies the output of the second band-pass filter and a demodulator that demodulates the outputs of the first and second IF amplifiers as an input signal, extracts a modulating signal and applies it to the baseband circuit, and is characterized in that the frequency generator includes the frequency generator described in any of above (1) to (17).

DETAILED DESCRIPTION OF THE PREFERRED EMBODIMENTS

In a frequency generator according to the invention based upon a frequency generator including an oscillator and a frequency doubler, a variable delay circuit, a voltage-swing detection circuit and an error amplifier are provided and a feedback loop for controlling the delay time of the variable delay circuit referring to the amplitude of the differential output of the frequency doubler is provided. The amplitude of the differential output can be equalized by such configuration. Therefore, the adjustment by multistage connection of the amplitude of differential output in the conventional type differential circuit is not required and even if an oscillation frequency of the oscillator is a few GHz or more, the frequency generator of lower power can be provided.

Referring to the attached drawings, concrete embodiments of the invention will be described in detail below.

First Embodiment

Figure 1:
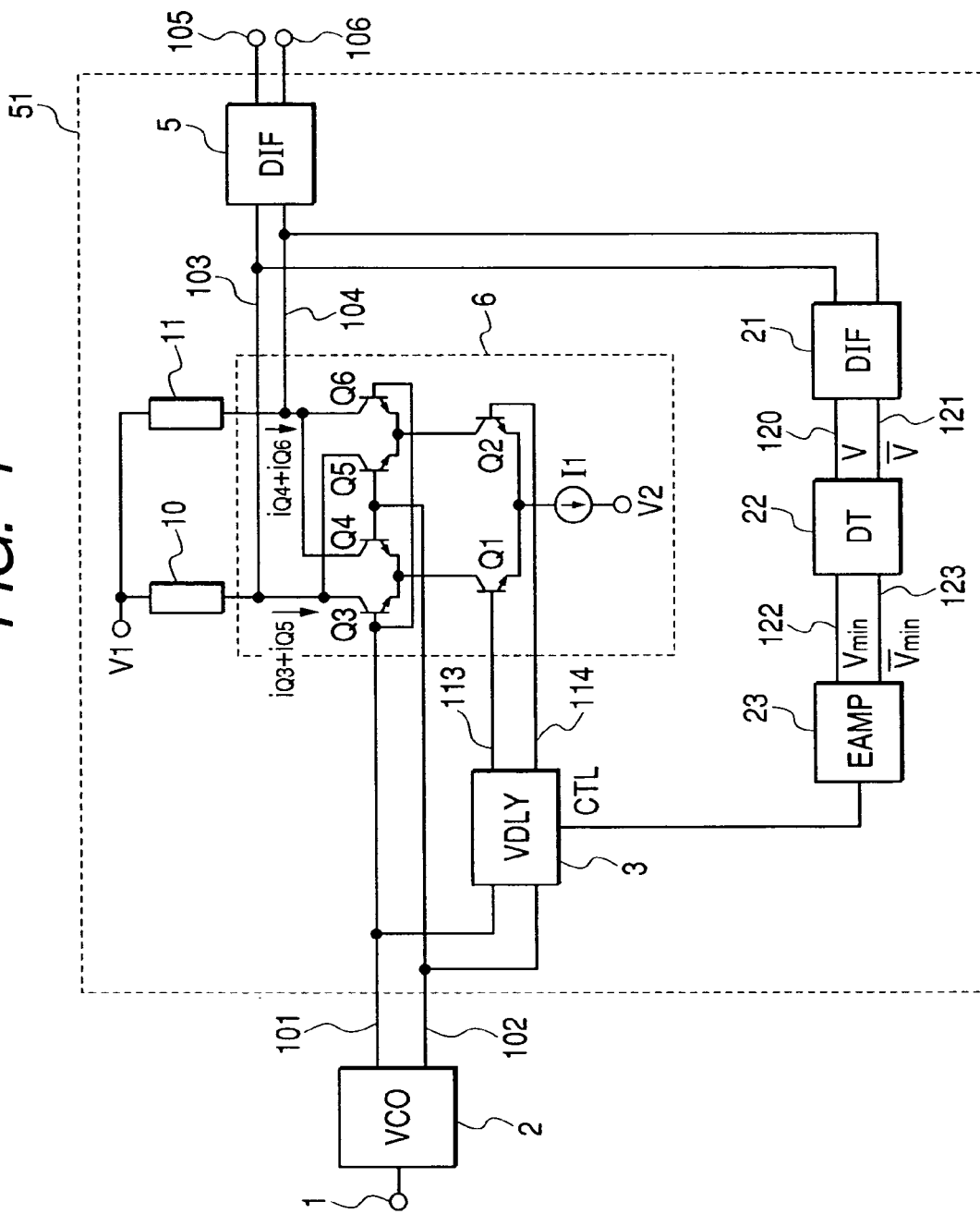
FIG. 1 is a circuit diagram showing a first embodiment of a frequency generator according to the invention.

FIG. 1 is a circuit diagram showing a first embodiment of the frequency generator according to the invention. A frequency doubler 51 in this embodiment is composed of a variable delay circuit (VDLY) 3, differential amplifiers (DIF) 5, 21, a Gilbert-type multiplier 6 which is a first configurational example, load circuits 10, 11, a voltage-swing detection circuit (DT) 22 and an error amplifier (EAMP) 23.

As in the first conventional type example, in a voltage controlled oscillator (VCO) 2, the oscillation frequencies of differential output signals 101 and 102 are controlled by voltage applied to a frequency control terminal 1. The Gilbert-type multiplier 6 is composed of differential pairs Q1 and Q2, Q3 and Q4, Q5 and Q6 of bipolar transistors. Output currents iQ3+iQ5, iQ4+iQ6 proportional to the result of the multiplication of two differential input voltage are sunk from a common collector of the transistors Q3 and Q5 and from a common collector of the transistors Q4 and Q6.

In this embodiment, the output of the voltage controlled oscillator 2 is branched in two, one differential output signals 101 and 102 are directly input to the bases of the transistors Q3 to Q6 of the Gilbert-type multiplier 6. Other differential signals 113 and 114 to which delay Td is added via the variable delay circuit 3 are input to the bases of the transistors Q1, Q2 of the Gilbert-type multiplier 6. Two output currents (iQ3+iQ5, iQ4+iQ6) of the Gilbert-type multiplier 6 are converted to voltage by common load circuits 10, 11 respectively having a frequency bandpass characteristic, however, only a desired double harmonic passes the common load circuits and emerges at nodes 103, 104. The common load circuits 10, 11 can convert two output currents of the Gilbert-type multiplier to voltage having selectivity depending upon a frequency. Hereby, output voltage can increase the amplitude of a desired frequency multiplied wave at 103, 104. Its concrete method depends upon circuit configuration including a parallel circuit composed of well-known inductor and capacitor and including a resistor in series with the inductor and the capacitor to adjust a selective range. In the following second to sixth embodiments, the similar common load circuits are used.

Then, in the invention, difference in amplitude between differential both phases is detected based upon transient waveforms emerging at the nodes 103 and 104, its information is applied to the variable delay circuit 3 and negative feedback control is made so that amplitudes at the nodes 103 and 104 are equal. A feedback circuit is composed of the differential amplifier 21, the voltage-swing detection circuit 22 that detects a minimum value of amplitude and the error amplifier 23 that converts differential voltage and applies to a control terminal CTL of the variable delay circuit 3 in the form of voltage.

Figure 2A:
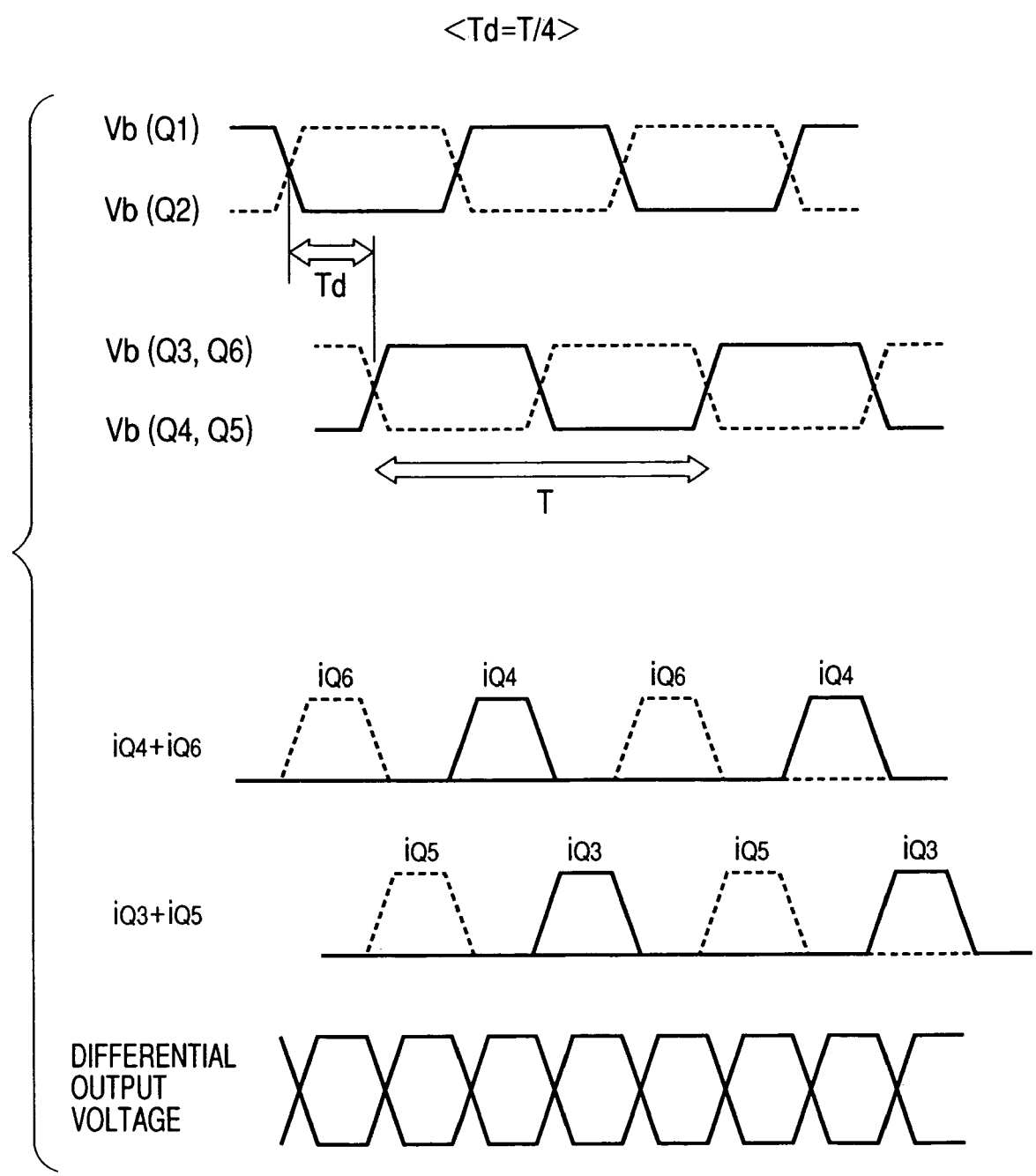
FIG. 2A is a timing chart showing an ideal case that the delay time Td of a variable delay circuit is T/4 and FIG. 2B is a timing chart showing an unsuitable case that the delay time Td of the variable delay circuit is not T/4.

First, referring to FIGS. 2A and 2B, relation between the operation of the Gilbert-type multiplier 6 and delay time will be described. FIG. 2A is a timing chart showing a case that the delay time Td of the variable delay circuit 3 is ideal delay time T/4 and T denotes an input signal cycle. In the timing chart, for convenience, the amplitude of current and voltage is represented as fixed.

When the timing chart shown in FIG. 2A is viewed from the upside to the downside, the collector current iQ4 of the transistor Q4 flows when the base potential Vb (Q2) of the transistor Q2 is at a high level and the base potential Vb (Q4, Q5) of the transistor Q4 or Q5 is at a high level for example. A period in which the collector current flows is T/4. Similarly, after a half period of an input frequency, the collector current iQ6 of the transistor Q6 flows. As the collectors of the transistors Q4 and Q6 are connected in the form of wired OR, output current IQ4+iQ6 flows every half period of an input frequency. That is, doubling operation is executed.

Figure 2B:
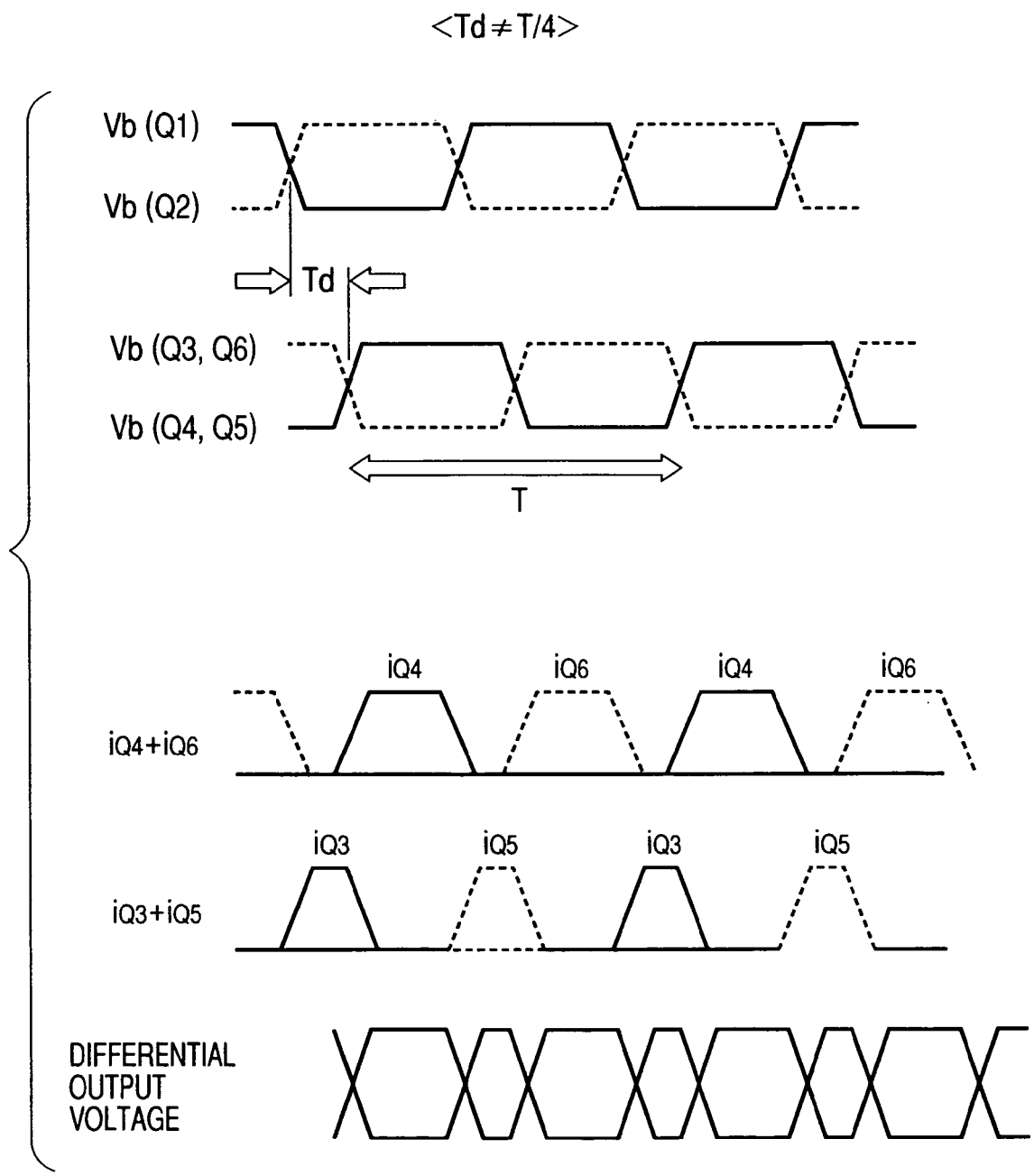

However, when delay time Td generated in the variable delay circuit 3 is unsuitable, a problem that the duty represented as iQ3+iQ5, iQ4+iQ6 of differential output current is off 50% as shown in FIG. 2B occurs. As a result, in case differential output voltage is saturated, a problem that the duty varies from 50% as shown in FIG. 2B occurs.

Figure 3A:
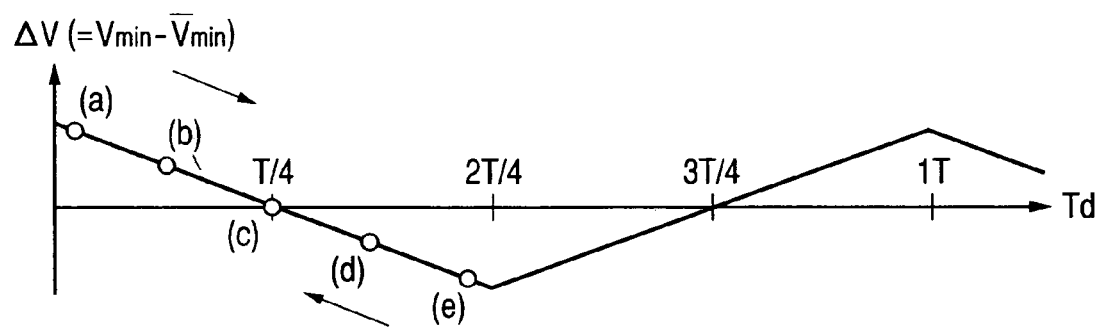
FIG. 3A shows relation between the amplitude difference ΔVmin of differential outputs in an ideal case that no delay is caused in a Gilbert-type multiplier and the delay time Td of the variable delay circuit.
Figure 3B:
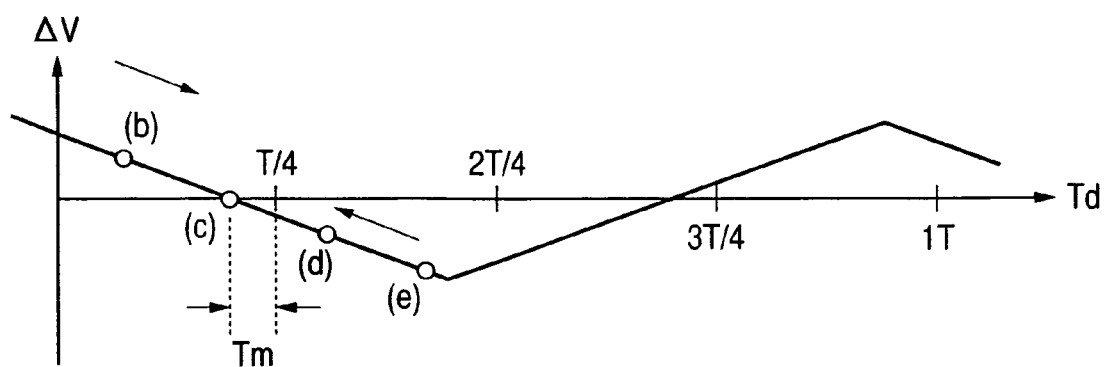
FIG. 3B shows relation between the amplitude difference ΔVmin of differential outputs in case the delay of the Gilbert-type multiplier is considered and the delay time Td of the variable delay circuit and FIG. 3C show amplitude waveforms of Vmin (full line: positive phase) and Vmin– (dotted line: negative phase) at differential output nodes 120, 121 corresponding to (a) to (e) shown in FIG. 3A.

FIGS. 3A and 3B show the simulation of the operation of the Gilbert-type multiplier 6 in case an output frequency of the oscillator 2 shown in FIG. 1 is approximately 20 GHz by a simulator, FIG. 3A shows an ideal case in which the Gilbert-type multiplier has no delay, and FIG. 3B shows a case in which the delay of the Gilbert-type multiplier is considered. As shown in FIGS. 3A and 3B, an axis of an abscissa shows the delay time Td of the variable delay circuit 3. An axis of an ordinate shows difference, that is, difference in amplitude ΔVmin (=Vmin−Vmin−) acquired by inputting outputs at the nodes 103 and 104 to the differential amplifier 21 and checking minimum values of the amplitude of output voltage (at nodes 120, 121) in a positive phase Vmin and in a negative phase Vmin− ("−" is used for a bar symbol showing the negative phase).

Figure 3C:
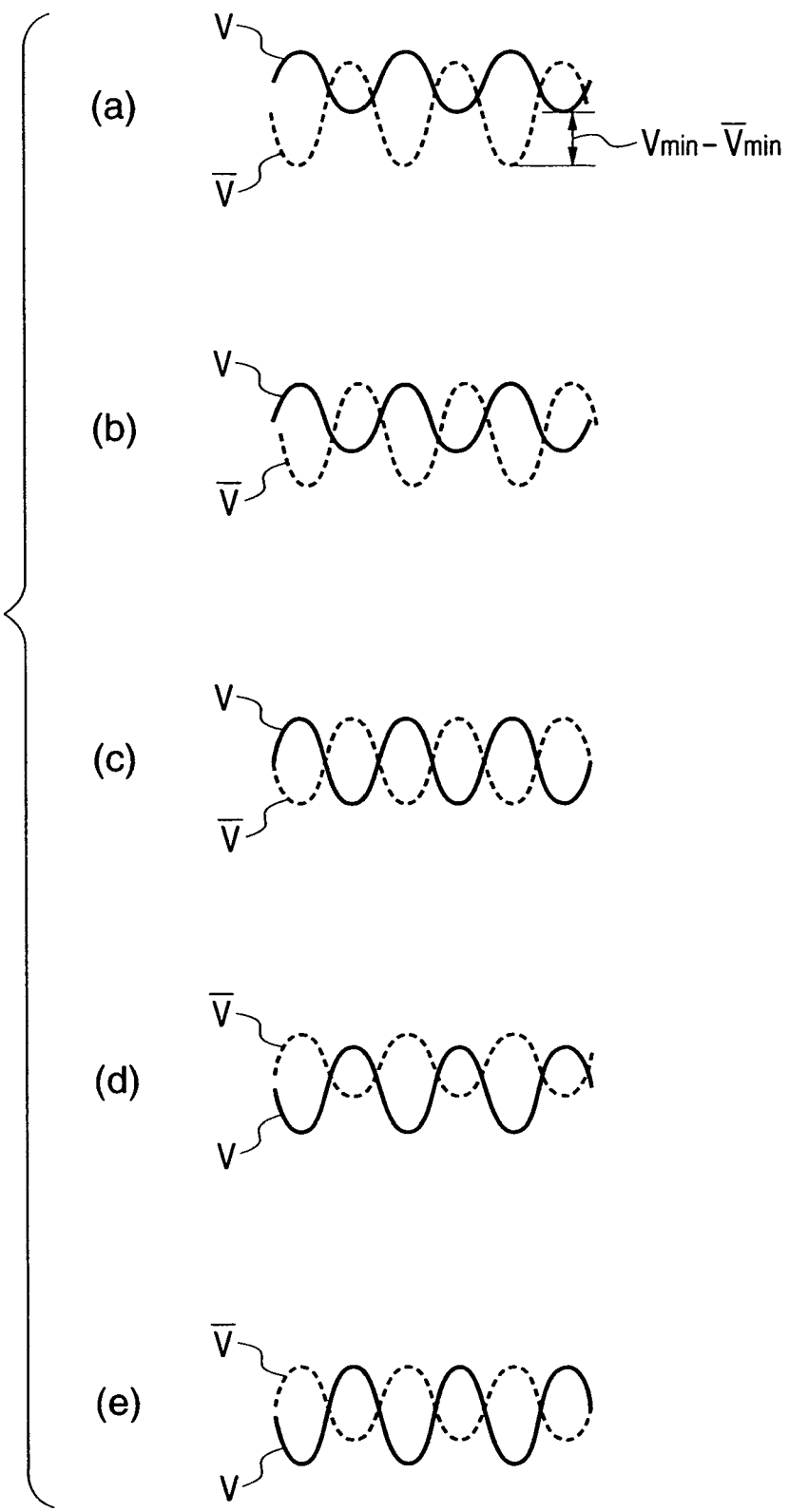

As clear from FIG. 3A, the difference between amplitude minimum values (Vmin, Vmin−) converges at zero when Td=T/4. The farther delay time is off a condition of Td=T/4, the larger the difference between amplitude minimum values is. Therefore, control over the delay time of the variable delay circuit is enabled by referring to difference between the amplitude minimum values of signals V and V− emerging at the nodes 120 and 121, Vmin−Vmin−. FIG. 3C (a) to (e) show waveforms of Vmin (full line: positive phase) and waveforms of Vmin− (dotted line: negative phase) at the nodes 120 and 121 in case the delay time Td of the variable delay circuit 3 varies from (a) to (e) shown in FIG. 3A. FIG. 3A shows a case that no delay time is considered in the Gilbert-type multiplier 6. From (c) in FIG. 3C, it is known that when Td=T/4, amplitudes in a positive phase and a negative phase are equal.

However, as shown in FIG. 1, in case delayed signals are input to a lower differential pair (Q1, Q2) of the Gilbert-type multiplier 6, delay time Tm in which the signals are sent from the base voltage to the collector current of the transistors Q1 and Q2 is also required to be considered. That is, delay time Td applied in the variable delay circuit 3 is a value acquired by subtracting Tm from the ideal delay time of T/4. FIG. 3B shows relation between difference Vmin−Vmin− between amplitude minimum values in case the delay Tm of the Gilbert-type multiplier 6 which is a differential multiplier is considered and the delay time Td of the variable delay circuit 3.

The differential output amplitudes of the Gilbert-type multiplier 6 can be equalized by making the difference Vmin−Vmin− of the amplitudes minimum values of signals emerging at the nodes 120 and 121 based upon the above-mentioned examination.

Figure 4:
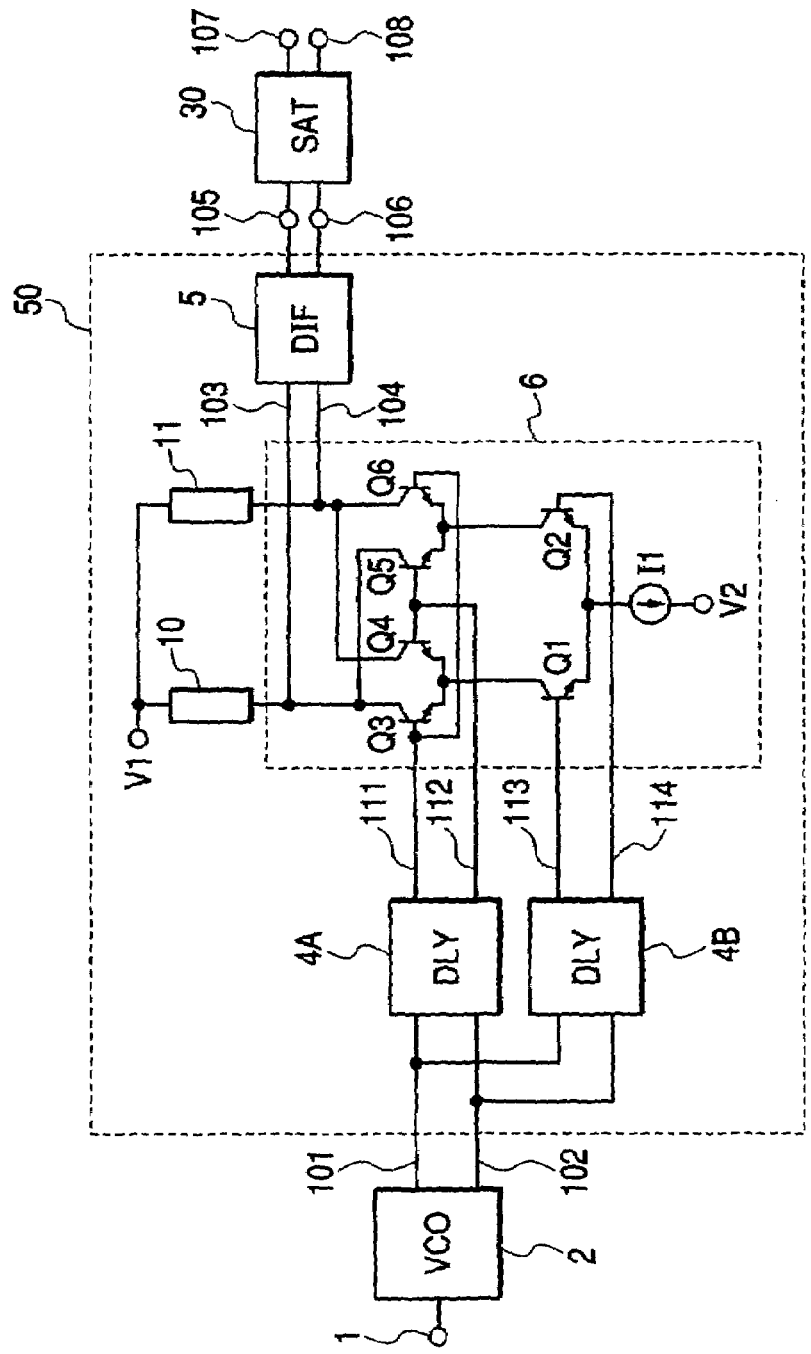
FIG. 4 is a block diagram showing a frequency generator using a frequency doubler showing a first conventional type example.

Heretofore, consumed current is approximately 10 mA using the differential amplifier for saturating amplitude 30 shown in FIG. 4 in which differential amplifiers are cascaded by two steps, while according to this embodiment, the similar effect can be produced at the consumed current of total approximately 4 mA of approximately 3 mA by the differential amplifier 21, approximately 0.5 mA in the voltage-swing detection circuit 22 in which low-speed operation is allowed and approximately 0.5 mA in the error amplifier so as to equalize the differential output amplitudes of the Gilbert-type multiplier 6.

The effect by the above-mentioned negative feedback control for equalizing the differential output amplitudes of the Gilbert-type multiplier 6 is also acquired by increasing the output potential of the variable delay circuit shown in FIG. 1 so that the output potential is higher than the output potential 101, 102 of VCO by approximately 1 V, connecting 113 and 114 to an upper differential pair of the Gilbert-type multiplier 6 and directly connecting the lower differential pair to the outputs 101 and 102 of the oscillator. In this case, control is required to be made so that the control is negative feedback control by reversing an output phase of the error amplifier 23, that is, so that a direction in which delay time is changed is a reverse direction.

The configuration of the Gilbert-type multiplier 6 shown in FIG. 1 is a first configurational example of the Gilbert-type multiplier in the frequency generator according to the invention. In FIG. 1, V1 denotes a power source on the high potential side, V2 denotes a power source on the low potential side, and I1 denotes a current source.

In the voltage-swing detection circuit 22 shown in FIG. 1, the minimum values of signal amplitudes at the nodes 120 and 121 are detected by checking them in the positive phase and in the negative phase to detect an amplitude minimum value, however, in place, it need scarcely be said that the maximum values of signal amplitudes at the nodes 120 and 121 are detected, that is, the maximum values of amplitudes in the positive phase and in the negative phase are checked, difference (amplitude difference) between the maximum values is detected and feedback control may be also made. In that case, it is desirable for the voltage-swing detection circuit that a voltage-swing maximum value detection circuit in a thirteenth embodiment described later is used.

Besides, for an oscillator, the voltage controlled oscillator 1 has been described, however, an oscillator of a type in which differential signals which can control its oscillation frequencies by current signals are output may be also used.

Besides, in this embodiment, for the output of the Gilbert-type multiplier 6, differential output signals 105, 106 as the frequency generator are extracted via the differential amplifier 5. However, the differential amplifier 5 also functions as a buffer amplifier for preventing from having an effect upon the load impedance of a circuit connected to the output terminal of the frequency generator and the impedance of the loads 10, 11 of the Gilbert-type multiplier 6 forming the frequency doubler, and in case a load of the circuit connected to the output terminal of the frequency generator is known beforehand and the variation does not matter, the differential amplifier 5 is not necessarily required. It is desirable from the viewpoint of the stability of the output of the frequency generator that the differential amplifier 5 is provided. In the following embodiments, it is also similar, however, in FIG. 1, configuration in which the differential amplifier 5 is provided is shown.

Second Embodiment

Figure 5:
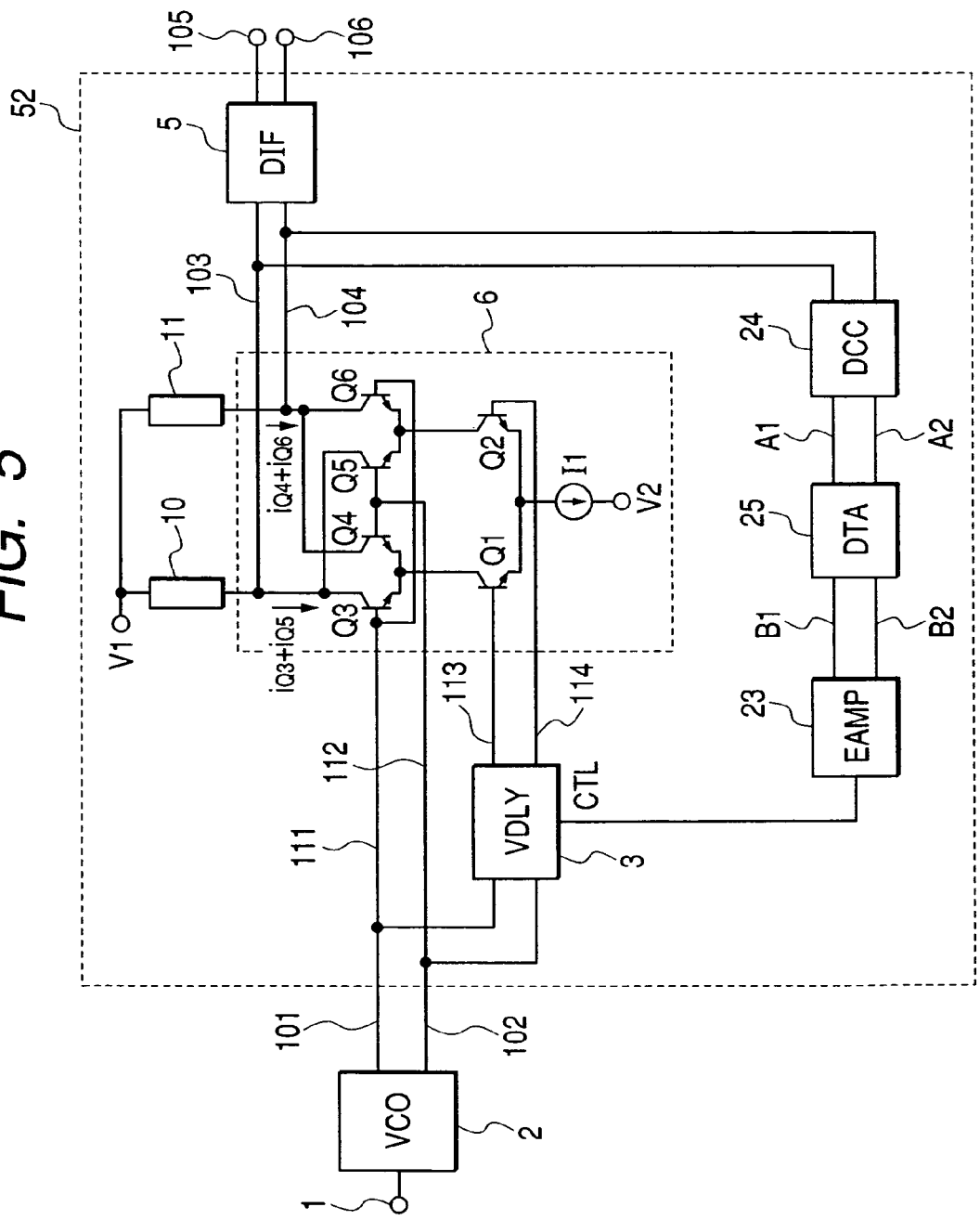
FIG. 5 is a block diagram showing a second embodiment of the frequency generator according to the invention.

FIG. 5 is a circuit diagram showing a second embodiment of the frequency generator according to the invention. To avoid the repetition of the description, the same reference number is allocated to the same component as that in the first embodiment and the detailed description is omitted. This embodiment is different from the first embodiment in a feedback path forming a path from output nodes 103, 104 of a Gilbert-type multiplier 6 forming a multiplier 52 in a frequency generator to a control terminal CTL of a variable delay circuit 3.

That is, the feedback path is composed of a DC decoupling circuit (DCC) 24, a voltage-swing value detection circuit (DTA) 25 that detects a voltage-swing value based upon the maximum value and the minimum value of amplitude in differential both phases and an error amplifier 23 that converts differential voltage in the amplitude of differential outputs and applies it to the control terminal of the variable delay circuit 3 in the form of voltage.

Effect acquired by such configuration can equalize the amplitude of the differential output signals of the Gilbert-type multiplier as in the frequency generator in the first embodiment.

As in this embodiment, the differential amplifier 21 used in the first embodiment is not used in the feedback path, this embodiment has an advantage that current consumed in the feedback path can be reduced and the similar effect can be acquired at the consumed current of approximately 1 mA.

The DC decoupling circuit 24 may be formed by a coupling capacitor or a high-pass filter.

Third Embodiment

Figure 6:
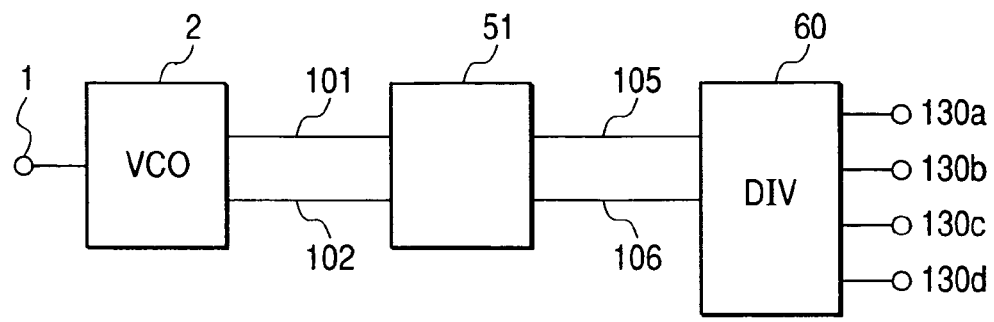
FIG. 6 is a block circuit diagram showing a main part of a third embodiment of the frequency generator according to the invention.

FIG. 6 is a block diagram showing a main part of a third embodiment of the frequency generator according to the invention. In this embodiment, the same reference number is allocated to the same component as that in the configuration shown in FIG. 1. In this embodiment, a frequency generator that generates signals having phase difference by 90° from differential output signals 101, 102 oscillated in an oscillator 2 is configured.

Therefore, in the frequency generator, the output signals 105, 106 from the oscillator 2 of the first frequency doubler 51 according to the invention described in the first embodiment are input to input terminals of a D flip flop-type 1:2 frequency divider (DIV) 60. In this case, the D flip flop-type 1:2 frequency divider 60 generates four signals of 0°, 90°, 180°, 270° shifted by 90° from a 1:2 divided signal of each input frequency and can output them to respective output terminals 130a, 130b, 130c, 130d.

As described above, the input amplitude of the D flip flop-type 1:2 frequency divider can be equalized in a positive phase and in a negative phase of differential outputs by arranging the frequency doubler 51 according to the invention that doubles the oscillation frequency of the oscillator 2 before the D flip flop-type 1:2 frequency divider. As a result, as an upper limit value of the working frequency of the D flip flop-type 1:2 frequency divider can be enhanced, the working upper limit speed of the frequency generator in this embodiment can be enhanced.

Fourth Embodiment

Figure 7:
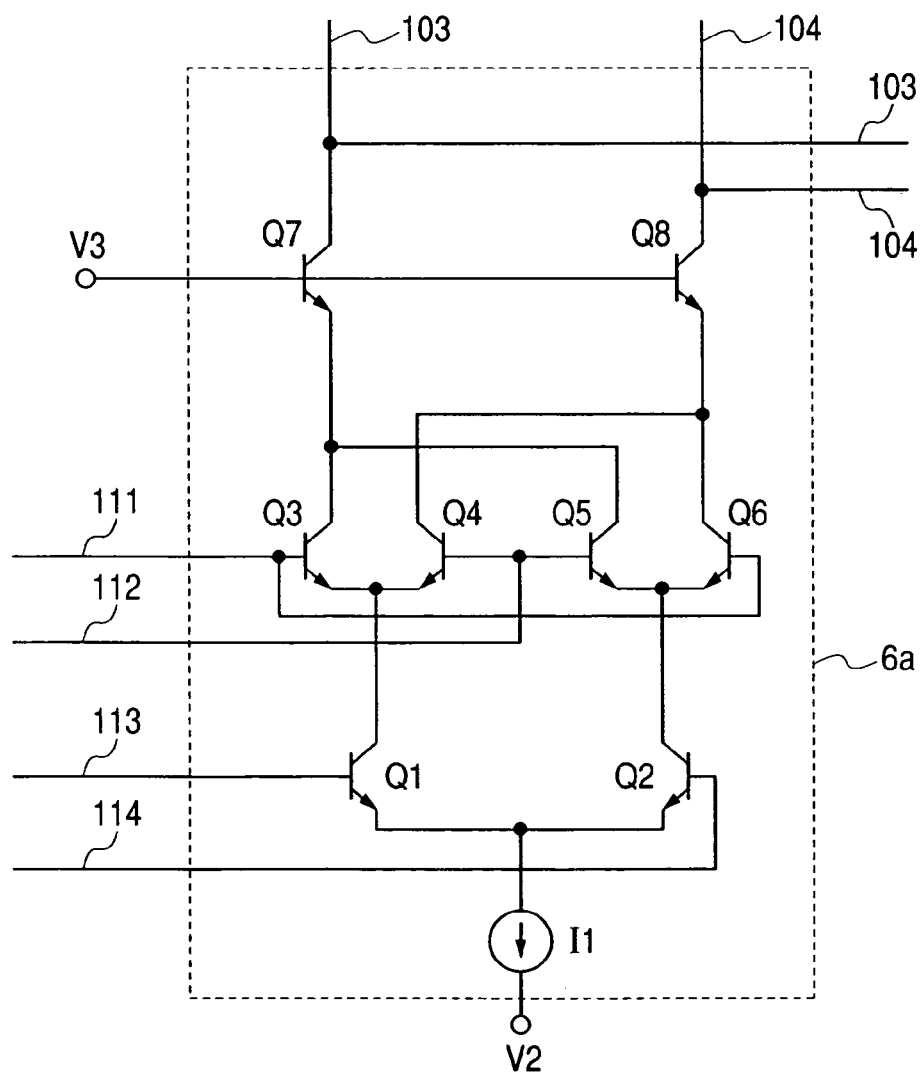
FIG. 7 is a circuit diagram showing a second configurational example of the Gilbert-type multiplier used in the frequency generator according to the invention.

FIG. 7 is a circuit diagram showing a second configurational example of the Gilbert-type multiplier used in the frequency generator according to the invention. In this embodiment, the same reference number is allocated to the same component as that in the configuration shown in FIG. 1.

A Gilbert-type multiplier 6a in this embodiment is different from the Gilbert-type multiplier 6 shown in FIG. 1 in that cascode-coupled transistors Q7 and Q8 are provided. That is, in the embodiments shown in FIGS. 1 and 5, the transistors Q3 and Q5 are connected to the node 103 and the transistors Q4 and Q6 are connected to the node 104, while in this embodiment, only the transistors Q7 and Q8 are connected to output nodes 103 and 104.

Therefore, parasitic capacity between the base and the collector of the transistor at the output node and parasitic capacity between the collector and a substrate can be reduced. Therefore, the working upper limit of the frequency generator can be enhanced by using the Gilbert-type multiplier 6a in this embodiment in place of the Gilbert-type multiplier 6 in the frequency generator shown in FIG. 1. The total parasitic capacity of the output node can be adjusted depending upon the size of the transistors Q7 and Q8.

Fifth Embodiment

Figure 8:
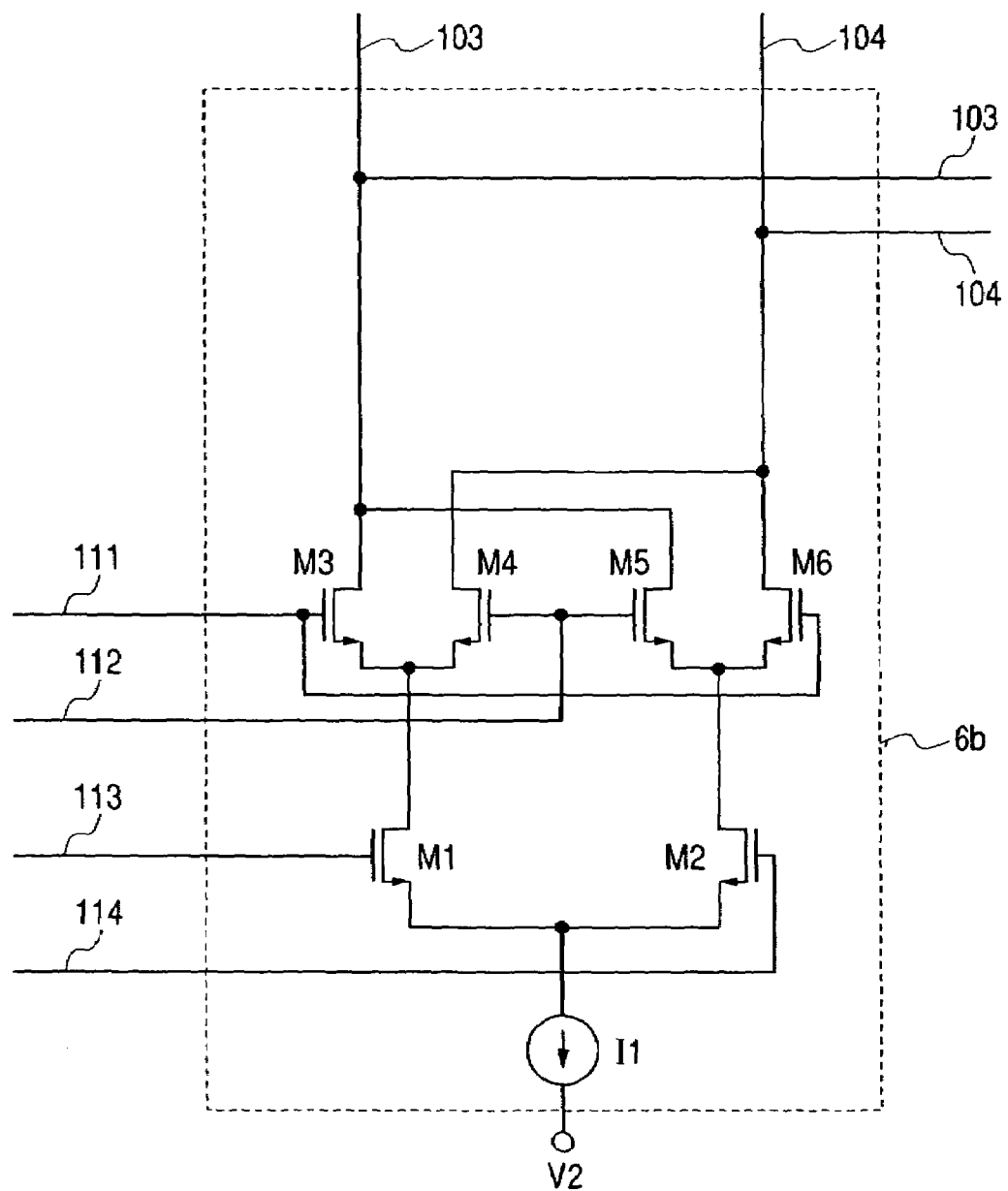
FIG. 8 is a circuit diagram showing a third configurational example of the Gilbert-type multiplier used in the frequency generator according to the invention.

FIG. 8 is a circuit diagram showing a third configurational example of the Gilbert-type multiplier used in the frequency generator according to the invention. A Gilbert-type multiplier 6b in this embodiment is different from the Gilbert-type multiplier 6 shown in FIG. 1 in that the Gilbert-type multiplier in this embodiment is composed of MOS transistors M1 to M6 in place of the bipolar transistors Q1 to Q6.

The absolute value of power supply voltage required for the operation of the Gilbert-type multiplier 6 shown in FIG. 1 is 3 V for example, while in case the threshold voltage Vth of the MOS transistor is 0.4 V, the absolute value of power supply voltage required for the operation of the Gilbert-type multiplier 6b in this embodiment can be reduced up to approximately 2 V by using the MOS transistors.

Sixth Embodiment

Figure 9:
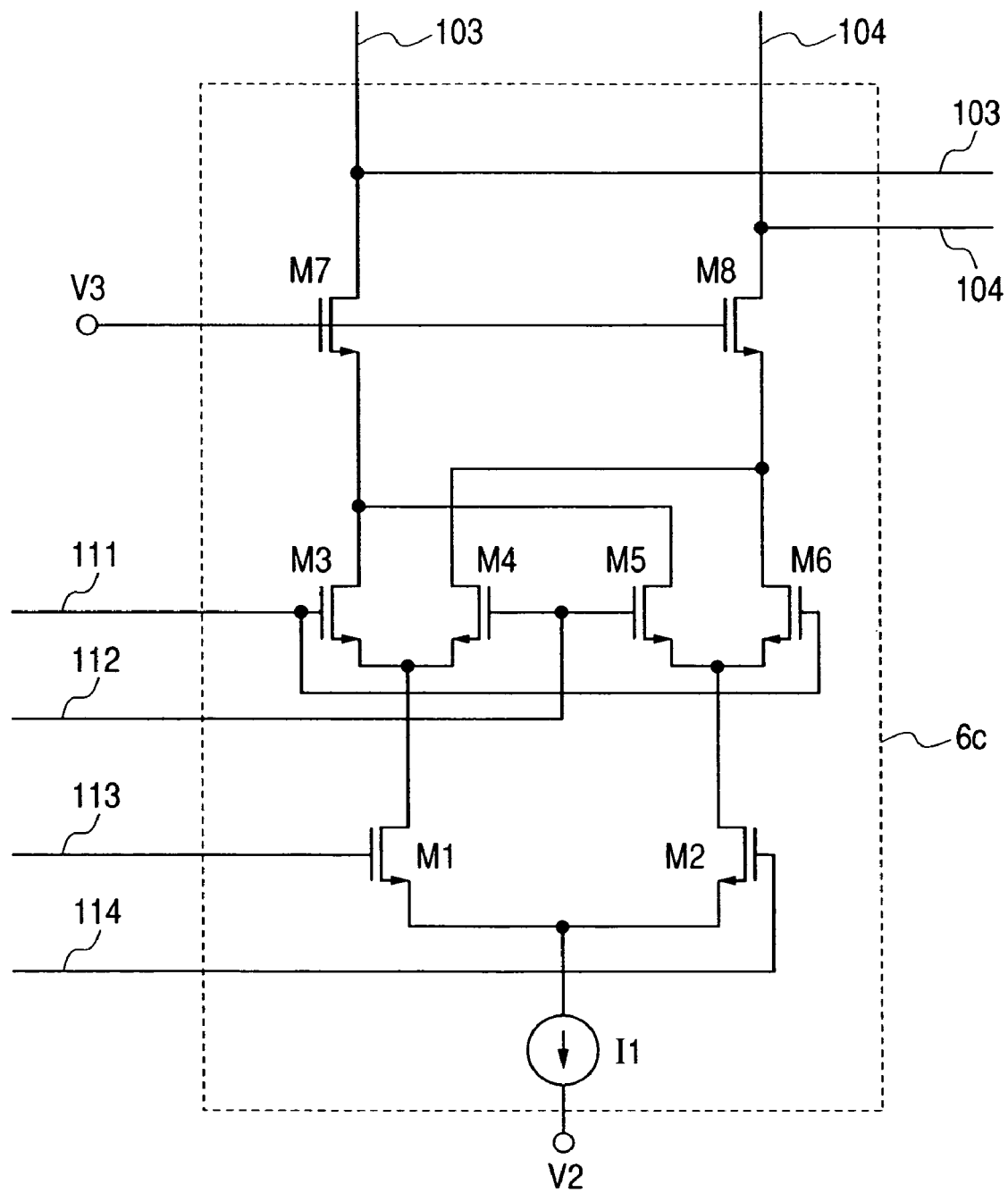
FIG. 9 is a circuit diagram showing a fourth configurational example of the Gilbert-type multiplier used in the frequency generator according to the invention.

FIG. 9 is a circuit diagram showing a fourth configurational example of the Gilbert-type multiplier used in the frequency generator according to the invention. In this embodiment, the same reference number is allocated to the same component as that in the configuration shown in FIG. 8.

A Gilbert-type multiplier 6c in this embodiment is different from the Gilbert-type multiplier 6b shown in FIG. 8 in that cascode-coupled transistors M7 and M8 are provided. That is, in the embodiment shown in FIG. 8, the transistors M3 and M5 are connected to the node 103 and the transistors M4 and M6 are connected to the node 104, while in this embodiment, only MOS transistors M7 and M8 are connected to output nodes 103 and 104.

Therefore, parasitic capacity between the gate and the drain of the transistor at the output node and parasitic capacity between the drain and a substrate can be reduced. Therefore, the working upper limit of the frequency generator can be enhanced by using the Gilbert-type multiplier 6c in this embodiment in place of the Gilbert-type multiplier 6 in the frequency generator shown in FIG. 1. The total parasitic capacity at the output node can be adjusted depending upon the size of the MOS transistors M7 and M8. Further, in case the threshold voltage Vth of the MOS transistor is 0.4 V, the absolute value of power supply voltage required for the operation can be reduced up to approximately 2.4 V.

Seventh Embodiment

Figure 10:
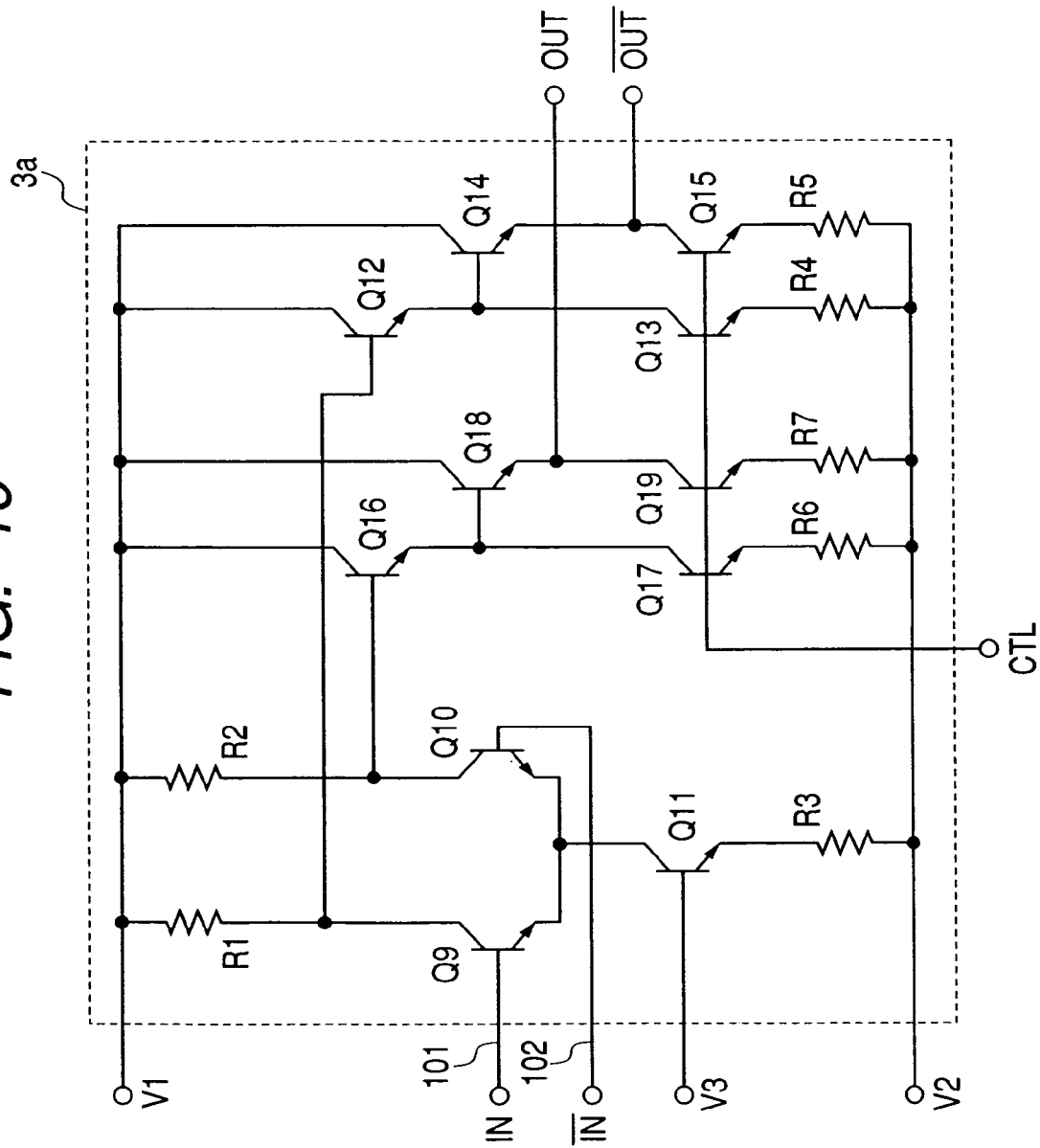
FIG. 10 is a circuit diagram showing a first configurational example of the variable delay circuit used in the frequency generator according to the invention.

FIG. 10 is a circuit diagram showing a first configurational example of the variable delay circuit used in the frequency generator according to the invention. A variable delay circuit 3a in this embodiment is configured by a differential amplifier composed of transistors Q9 to Q11 and resistors R1 to R3 and an emitter follower composed of transistors Q12 to Q19 and resistors R4 to R7, the bases of the transistors Q9 and Q10 function as differential input terminals IN, IN–, and the emitters of the transistors Q14 and Q18 function as differential output terminals OUT, OUT–.

Constant voltage V3 is applied to the base of the transistor Q11 and the transistor Q11 is operated as a constant current source. The bases of the transistors Q13, Q15, Q17, Q19 can vary the bias current of the emitter follower. Therefore, as delay time that varies depending upon bias current can be controlled in case the common base of the transistors Q13, Q15, Q17, Q19 is used for a delay time control terminal CTL, the variable delay circuit 3a in this embodiment can be used by inputting the differential input signals 101, 102 shown in FIG. 1 to the input terminals IN, IN– of the variable delay circuit 3a and making output signals from the output terminals OUT, OUT– the output signals 113, 114 of the variable delay circuit in place of the variable delay circuits 3, 4 shown in FIG. 4 and the variable delay circuit 3 shown in FIG. 5.

Eighth Embodiment

Figure 11:
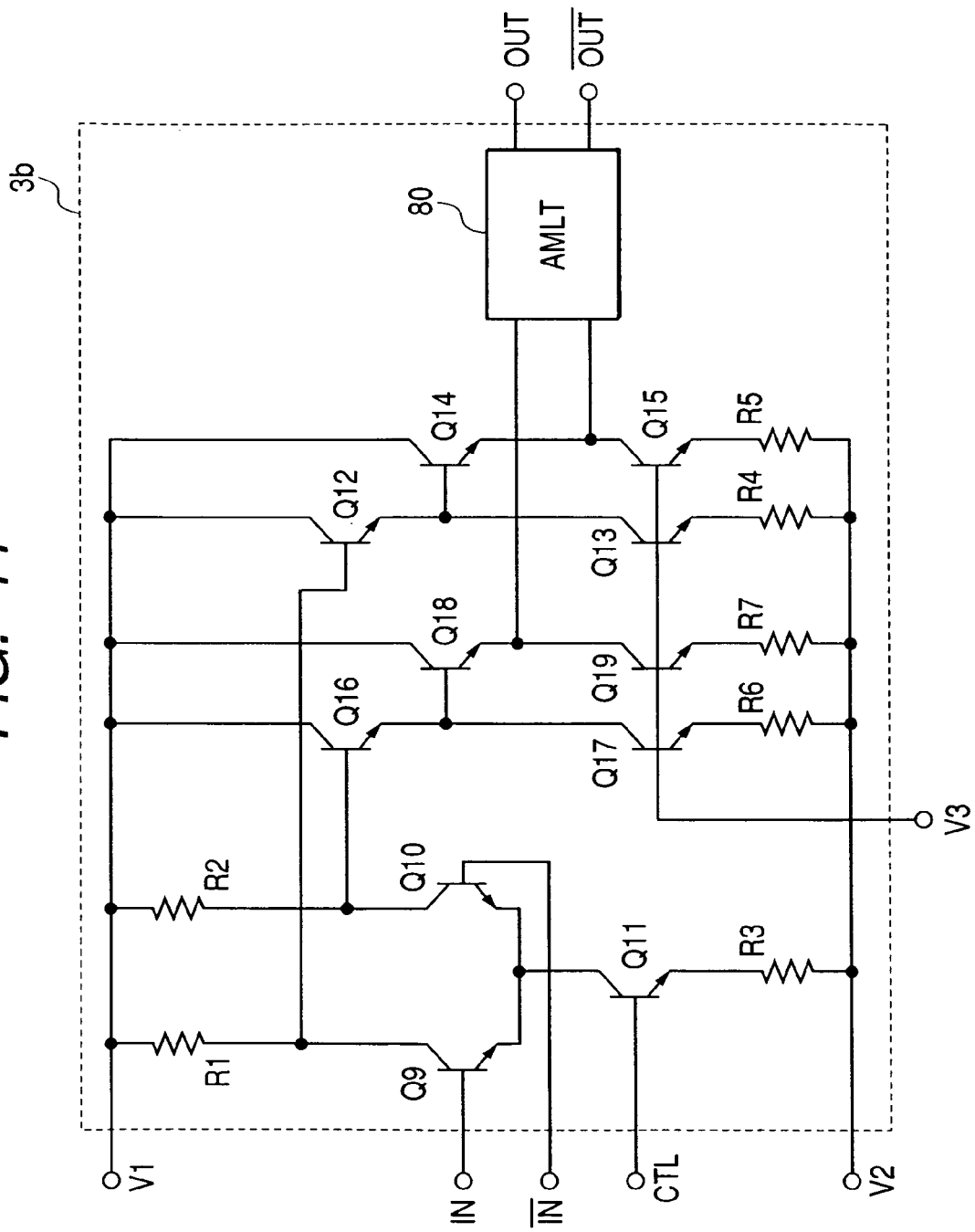
FIG. 11 is a circuit diagram showing a second configurational example of the variable delay circuit used in the frequency generator according to the invention.

FIG. 11 is a circuit diagram showing a second configurational example of the variable delay circuit in the frequency generator according to the invention. In this embodiment, the same reference number is allocated to the same component as that in the configuration shown in FIG. 10. A variable delay circuit 3b in this embodiment is configured by a differential amplifier composed of transistors Q9 to Q11 and resistors R1 to R3 and an emitter follower composed of transistors Q12 to Q19 and resistors R4 to R7, the bases of the transistors Q9 and Q10 function as differential input terminals IN, IN–, differential outputs are output from the emitters of the transistors Q14 and Q18, and the differential outputs are extracted from output terminals OUT, OUT– via an amplitude limiter (AMLT) 80. For the amplitude limiter 80, a well-known emitter-coupled differential amplifier for example has only to be used.

Differently from the embodiment shown in FIG. 10, constant voltage V3 is applied to the bases of the transistors Q13, Q15, Q17, Q19, the transistors are operated as a constant current source, and the base of the transistor Q11 is connected to a delay time control terminal CTL. The bias current of the differential amplifier varies depending upon voltage applied to the delay time control terminal CTL and delay time in the differential amplifier can be varied.

In the variable delay circuit 3b in this embodiment, as voltage amplitude at the collectors of the transistors Q9 and Q10 is varied by increasing or decreasing the bias current of the differential amplifier, voltage amplitude at the emitters of the transistors Q14 and Q18 varies depending upon voltage applied to the delay time control terminal CTL. Then, to fix amplitude, an amplitude limiter 80 is arranged in a rear part.

The variable delay circuit 3b in this embodiment configured as described above can be used in place of the variable delay circuits 3, 4 shown in FIG. 4 and the variable delay circuit 3 shown in FIG. 5.

Ninth Embodiment

Figure 12:
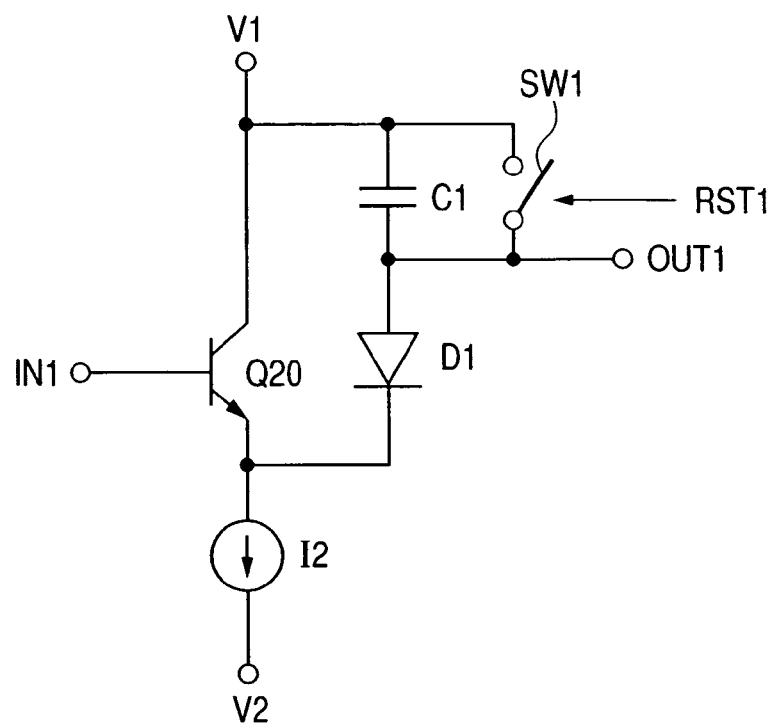
FIG. 12 is a circuit diagram showing a configurational example of a voltage-swing minimum value detection circuit used in the frequency generator according to the invention.

FIG. 12 is a circuit diagram showing a configurational example of a voltage-swing minimum value detection circuit used in the voltage-swing detection circuit 22 shown in FIG. 1 and the voltage-swing value detection circuit 25 shown in FIG. 5 in the frequency generator according to the invention.

The voltage-swing minimum value detection circuit is composed of a transistor 20, a diode D1, a current source 12, a capacitor C1 arranged between the anode of the diode D1 and a constant-voltage terminal V1 and a reset switch SW1 that releases and short-circuits two terminals of the capacitor C1 by a reset pulse RST1.

The reset pulse RST1 is supplied at timing at which the output frequency of the frequency generator according to the invention not shown is varied, or at timing at which power supply voltage and ambient temperature vary and further, at timing at which negative feedback is disabled for any cause.

In case voltage at the base IN1 of the transistor Q20 is lower than the potential of the anode of the diode D1 determined by charge already stored in the capacitor C1, the diode D1 is turned on, the potential of the anode is equalized to the input potential of the base, minimum voltage is held by the stored charge of the capacitor C1 and emerges at an output terminal OUT1 connected to the capacitor C1. As described above, a voltage-swing minimum value detection function is realized. To reset output voltage, the capacitor C1 is short-circuited by the reset switch, and the minimum value of amplitude is detected again.

In case the voltage-swing minimum value detection circuit shown in FIG. 12 and operated as described above is used for the voltage-swing detection circuit 22 shown in FIG. 1, the base IN1 of the transistor Q20 is connected to the input node 120, the output terminal OUT1 of the capacitor C1 is connected to the node 122, an amplitude minimum value Vmin in a positive phase is detected, similarly, another voltage-swing minimum value detection circuit is provided between the nodes 121 and 123, and an amplitude minimum value Vmin– in a negative phase has only to be detected.

Tenth Embodiment

Figure 13:
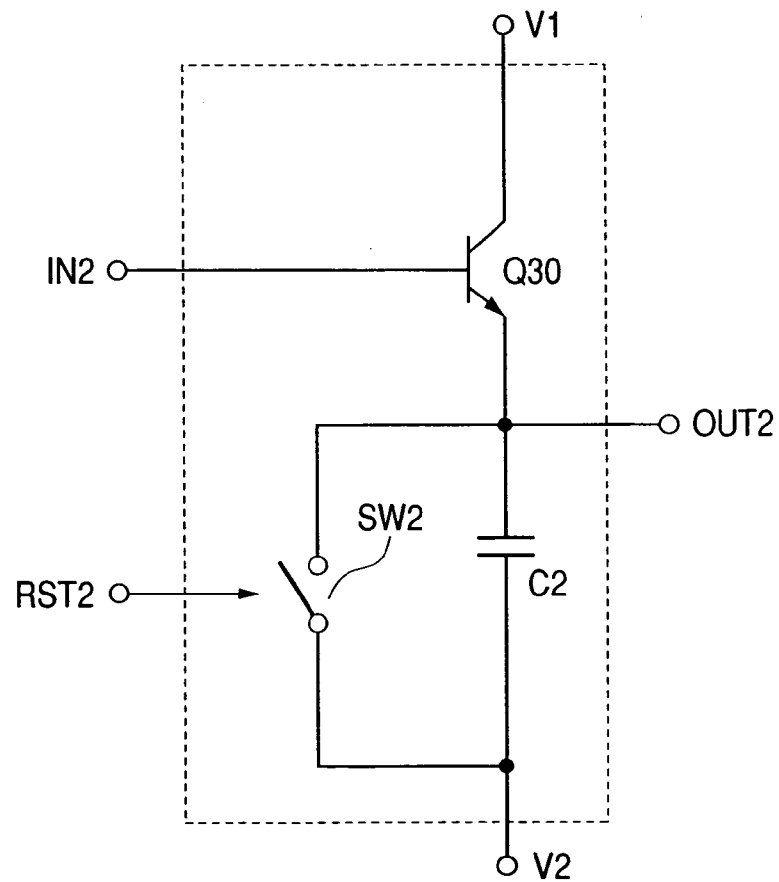
FIG. 13 is a circuit diagram showing a configurational example of a voltage-swing maximum value detection circuit used in the frequency generator according to the invention.

FIG. 13 is a circuit diagram showing a configurational example of the voltage-swing maximum value detection circuit used for the voltage-swing detection circuit 22 shown in FIG. 1 and the voltage-swing value detection circuit 25 shown in FIG. 5 in the frequency generator according to the invention.

A voltage-swing maximum value detection circuit is composed of a transistor Q30, a capacitor C2 arranged between its emitter and a constant-voltage power supply terminal on the low voltage side V2 and a reset switch SW2 that releases and short-circuits terminals of the capacity C2 by a reset pulse RST2. The reset pulse RST2 is supplied at timing at which the output frequency of the frequency generator according to the invention not shown is varied or at timing at which power supply voltage and ambient temperature vary and further, at timing at which negative feedback is disabled for any cause.

In case voltage applied to the base IN2 of the transistor Q30 increases, voltage at an output terminal OUT2 is increased because of charge stored in the capacitor C2, as a result, a maximum value of voltage applied to the input terminal IN2 is held as voltage between terminals of the capacitor C2, and emerges at the output terminal OUT2. As described above, a voltage-swing maximum value detection function is realized. To reset output voltage, the reset switch SW2 is short-circuited by a reset pulse RST2, charge stored in the capacitor C2 is discharged, and an amplitude maximum value is detected again.

To use the voltage-swing maximum value detection circuit shown in FIG. 13 and operated as described above for the voltage-swing detection circuit 22 shown in FIG. 1 and described in the latter half of the first embodiment in case difference between maximum values is detected, the base IN2 of the transistor Q30 is connected to the input node 120, the output terminal OUT2 of the capacitor C2 is connected to the node 122, an amplitude maximum value Vmax in a positive phase is detected, similarly, another voltage-swing maximum value detection circuit is provided between the nodes 121 and 123, and an amplitude maximum value Vmax– in a negative phase has only to be detected.

In case the voltage-swing value detection circuit 25 shown in FIG. 5 for detecting a maximum value and a minimum value is configured, the maximum value detection circuit in this embodiment and the above-mentioned voltage-swing minimum value detection circuit shown in FIG. 12 have only to be used. That is, the input terminal IN2 of the voltage-swing maximum value detection circuit in this embodiment and the input terminal IN1 of the voltage-swing minimum value detection circuit shown in FIG. 12 are connected to the input node A1 of the voltage-swing value detection circuit 25, amplitude values based upon a maximum value and a minimum value are detected from each output terminal OUT1, OUT2 and are output to the node B1, similarly, one more pair of the voltage-swing maximum value detection circuit and the voltage-swing minimum value detection circuit are provided to the node A2, amplitude values based upon a maximum value and a minimum value are detected and have only to be output to the node B2.

Eleventh Embodiment

Figure 14:
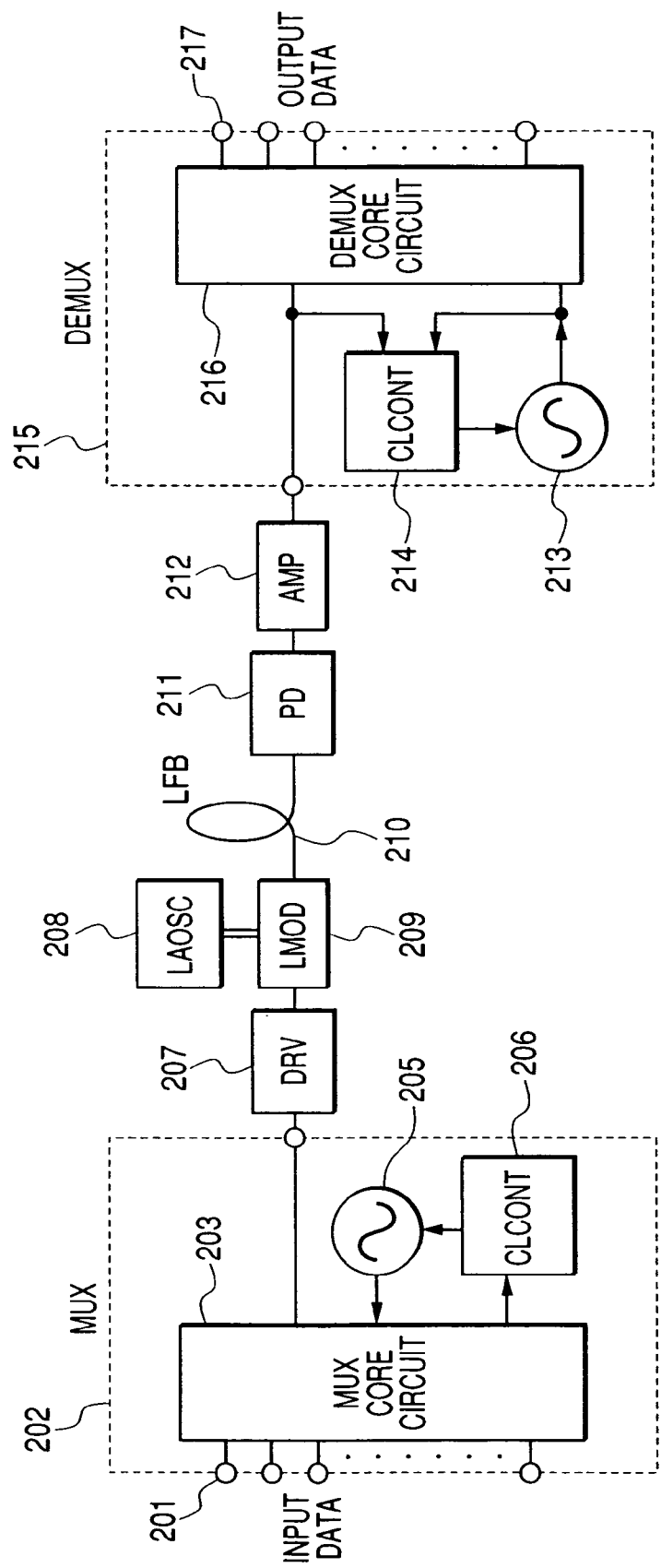
FIG. 14 is a block diagram showing an example of an optical communication system provided with the frequency generator according to the invention.

FIG. 14 is a block diagram showing an example of an optical communication system provided with the frequency generator according to the invention. A transmitter of the optical communication system is composed of a multiplexer (MUX) 202, a driver (DRV) 207, a laser oscillator (LAOSC) 208, an optical modulator (LMOD) 209 and others, a receiver is composed of a photodetector (PD) 211, an amplifier (AMP) 212, a demultiplexer (DEMUX) 215 and others, and the transmitter and the receiver are connected via an optical fiber (LFB) 210.

The multiplexer 202 on the side of the transmitter is composed of an MUX core circuit 203 that multiplexes plural low-speed input data signals from plural input terminals 201 to a high-speed signal, a clock control circuit (CLCONT) 206 and a frequency generator 205 that generates a reference signal of the MUX core circuit, and the driver 207 drives the optical modulator 209 according to a signal output from the multiplexer 202. The optical modulator 209 modulates a continuous wave from the laser oscillator 208 to be an optical signal and sends it to the receiver via the optical fiber 210.

On the side of the receiver, the optical signal is converted to an electric signal in the photodetector 211 by photoelectric conversion and the output of the amplifier 212 is input to the demultiplexer 215. The demultiplexer 215 is composed of a DEMUX core circuit 216 that demultiplexes a high-speed signal into plural low-speed signals, a clock control circuit 214 and a frequency generator 213 that generates a reference signal of the DEMUX core circuit, demultiplexes the high-speed signal into plural low-speed signals and outputs output data signals from plural output terminals 217.

As an oscillation frequency of the oscillator inside the frequency generator can be set to a low value by applying the frequency generator according to the invention using the frequency doubler having any configuration described in the first to eleventh embodiments as the frequency generator 205 on the side of the transmitter of the optical communication system configured as described above and the frequency generator 213 on the side of the receiver, the required high-speed performance of a transistor can be lowered and the manufacturing cost of the optical communication system can be reduced.

Twelfth Embodiment

Figure 15:
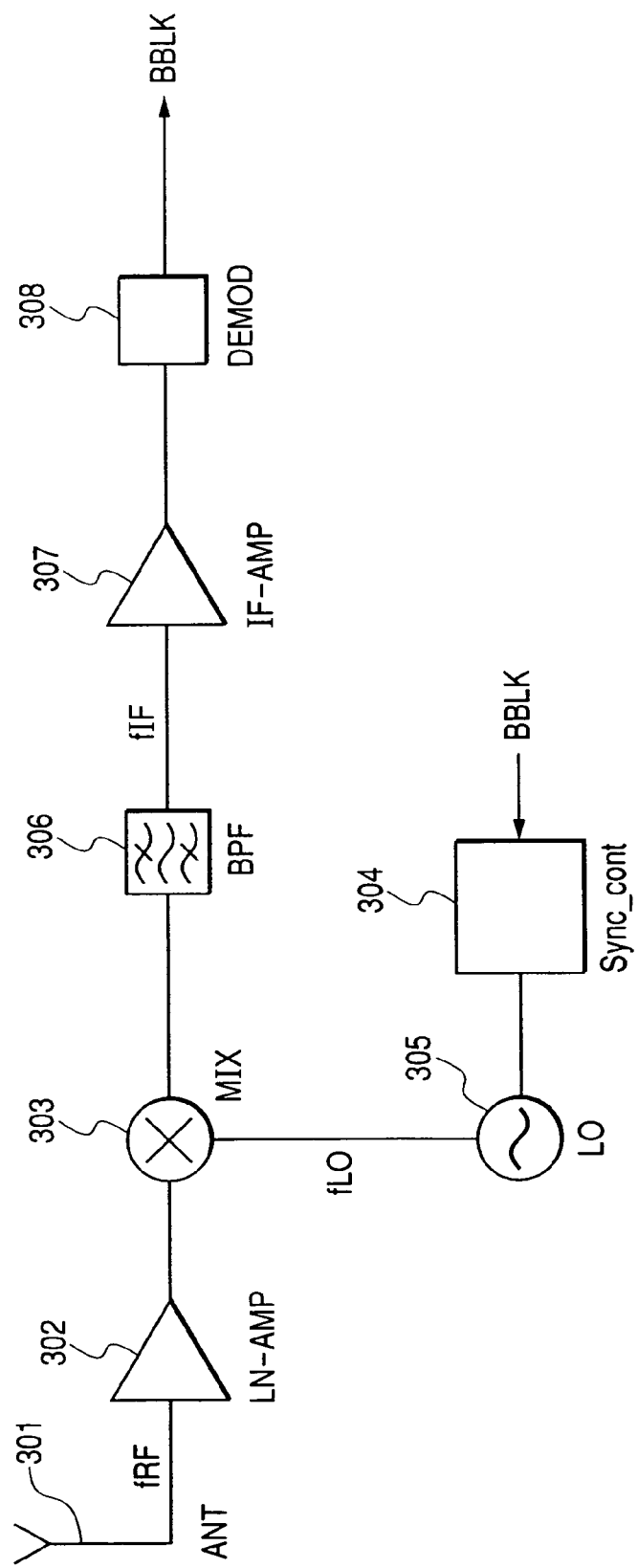
FIG. 15 is a block diagram showing an example of a radio communication system provided with the frequency generator according to the invention.

FIG. 15 is a block diagram showing an example of a radio communication system using the frequency generator according to the invention. This embodiment shows a case in which the invention is applied to a heterodyne radio receiver.

In the heterodyne radio receiver, a high-frequency signal fRF received in an antenna (ANT) 301 is amplified in a low noise amplifier (AMP) 302 and is input to one input terminal of a mixer (MIX) 303. An output signal fLO of a local oscillator (LO) 305 is controlled by a frequency generator control circuit (Sync_cont) 304 operated when a signal from a baseband circuit (BBLK) is received and is input to the other terminal of the mixer 303. After a carrier frequency of the received signal fRF is decreased in the output of the mixer 303 and an unnecessary frequency component is attenuated by a band-pass filter (BPF) 306, the received signal is amplified in an intermediate frequency amplifier (IF-AMP) 307, is extracted in a demodulator (DEMOD) 308 and is sent to the baseband circuit not shown. The baseband circuit is a circuit that applies required operation to an extracted signal.

An oscillation frequency of the oscillator inside the frequency generator can be set to a low value by applying the frequency generator according to the invention using the frequency doubler to the local oscillator 305 of the heterodyne radio receiver configured as described above. Therefore, the required high-speed performance of a transistor can be lowered and the manufacturing cost of the heterodyne radio receiver can be reduced.

Thirteenth Embodiment

Figure 16:
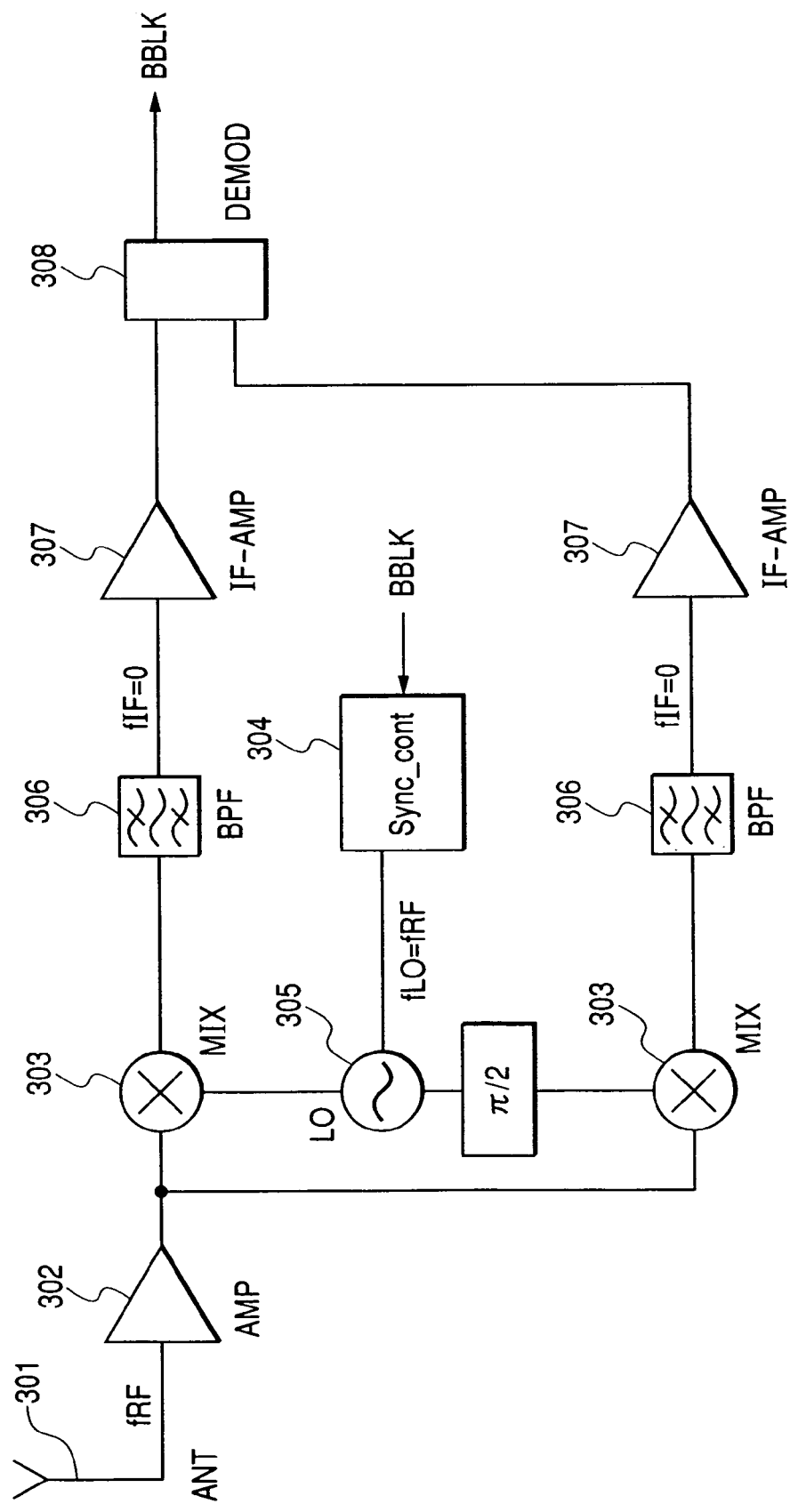
FIG. 16 is a block diagram showing another embodiment of the radio communication system provided with the frequency generator according to the invention.
Figure 17:
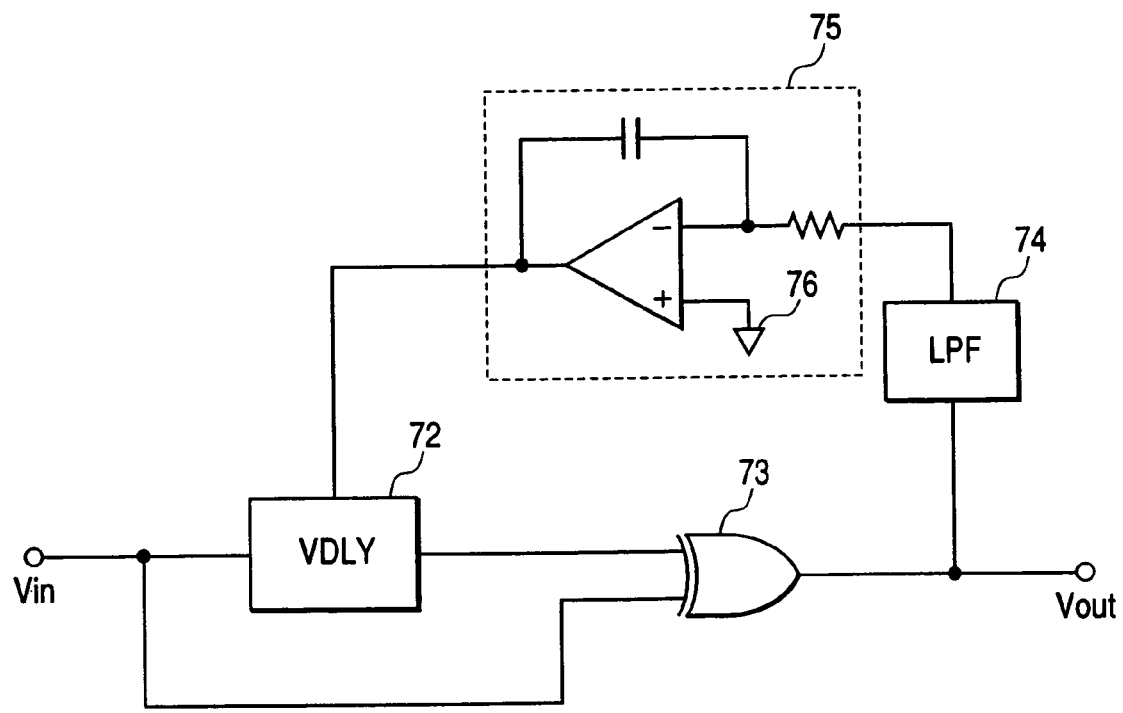
FIG. 17 is a block diagram showing a frequency doubler showing a second conventional type example.

FIG. 16 is a block diagram showing another embodiment of the radio communication system using the frequency generator according to the invention. This embodiment shows a case in which the invention is applied to a direct conversion radio receiver.

In the direct conversion radio receiver, a high-frequency signal fRF received in an antenna 301 is amplified in a low noise amplifier 302 to be an input signal to two mixers 303, 303, an output signal fLO (in this case, fLO=fRF) of a local oscillator (LO) 305 controlled by a frequency generator control circuit 304 is branched in two, phase difference of 90° (that is, π/2 [rad/sec]) is applied and two output signals are input to the mixers. After a carrier frequency of the signal amplified in the amplifier 302 is decreased in the outputs of the two mixers and an unnecessary frequency component is attenuated by a band-pass filter 306 (in this case, an IF frequency fIF=0), each signal is amplified in each IF amplifier 307. A demodulator 308 extracts signals from the outputs of two IF amplifiers 307, 307 and sends them to a baseband circuit (BBLK) not shown.

An oscillation frequency of the oscillator inside the frequency generator can be set to a low value by applying the frequency generator according to the invention having any configuration described in the first to eleventh embodiments to the local oscillator 305 of the direct conversion radio receiver configured as described above. Therefore, the required high-speed performance of a transistor can be lowered and the manufacturing cost of the direct conversion radio receiver can be reduced.

According to the invention, the amplitude of differential outputs is not required to be adjusted by the differential amplifier for saturating amplitude using the multi-stage connection of differential circuits as in the conventional type and even if an oscillation frequency of the oscillator is a few GHz or more, the low-power frequency generator can be realized.

What is claimed is:

1. A frequency generator, comprising:
   an oscillator that outputs differential signals which can control an oscillation frequency; and
   a frequency doubler to which the differential signals output from the oscillator are input, which doubles frequencies of the input signals and outputs differential signals, wherein:
   the frequency doubler comprises:
   a variable delay circuit;
   a differential multiplier provided with first differential input terminals to which the differential output signals of the oscillator are input via the variable delay circuit and second differential input terminals to which the differential output signals of the oscillator are input;

a voltage-swing detection circuit that detects each magnitude of an amplitude in a positive phase and in a negative phase of differential outputs of the differential multiplier; and a control circuit that controls a delay time of the variable delay circuit based upon an amplitude difference detected by the voltage-swing detection circuit; and wherein the differential outputs of the differential multiplier are coupled to output terminals of the frequency generator.

2. The frequency generator according to claim 1, further comprising:

a 1:2 frequency divider to which the differential outputs of the differential multiplier are input, which divides a frequency of the input in half, which generates, from the frequency-divided input, four phase-shifted signals having angular phases of 0, $\pi/2$, $\pi$, $3/2\pi$ [rad], respectively, and which outputs the four phase-shifted signals.

3. The frequency generator according to claim 1, wherein:
the control circuit controls the delay time of the variable delay circuit so that each magnitude of the amplitude in the positive phase and in the negative phase is equal.

4. The frequency generator according to claim 2, wherein:
the control circuit controls the delay time of the variable delay circuit so that each magnitude of the amplitude in the positive phase and in the negative phase is equal.

5. The frequency generator according to claim 1, wherein:
the control circuit controls the delay time of the variable delay circuit so that each magnitude of the amplitude in the positive phase and in the negative phase has fixed difference so as to make the duty of the differential outputs of the differential multiplier predetermined values.

6. The frequency generator according to claim 2, wherein:
the control circuit controls the delay time of the variable delay circuit so that each magnitude of the amplitude in the positive phase and in the negative phase has fixed difference so as to make the duty of the differential outputs of the differential multiplier predetermined values.

7. The frequency generator according to claim 1, wherein:
the differential multiplier includes a Gilbert-type multiplier.

8. The frequency generator according to claim 2, wherein:
the differential multiplier includes a Gilbert-type multiplier.

9. The frequency generator according to claim 3, wherein:
the differential multiplier includes a Gilbert-type multiplier.

10. The frequency generator according to claim 4, wherein:
the differential multiplier includes a Gilbert-type multiplier.

11. The frequency generator according to claim 5, wherein:
the differential multiplier includes a Gilbert-type multiplier.

12. The frequency generator according to claim 6, wherein:
the differential multiplier includes a Gilbert-type multiplier.

13. The frequency generator according to claim 1, wherein:
the variable delay circuit is a circuit that outputs differential signals according to the delay time of the variable delay control circuit and the differential signals output from the oscillator, the frequencies of the differential signals output from the oscillator being determined by a voltage applied to a frequency control terminal of the oscillator;

the differential multiplier is a Gilbert-type multiplier and differential output current of the Gilbert-type multiplier is extracted as differential output-voltage signals by load circuits that convert the current to voltage;

the voltage-swing detection circuit is a circuit that detects and outputs respective lower limit values in a positive phase and in a negative phase of the differential output-voltage signals of the load circuits; and the control circuit is an error amplifier to which the differential output voltage of the respective lower limit values in the positive phase and in the negative phase of the voltage-swing detection circuit is input, and which converts so that the voltage amplitude in the positive phase and in the negative phase of the differential output-voltage signals of the load circuits is a predetermined magnitude and outputs the predetermined magnitude to a control terminal of the variable delay circuit.

14. The frequency generator according to claim 13, further comprising:

first and second differential amplifiers to which the differential output-voltage signals from the load circuits are input, wherein:

the differential output of the first differential amplifier functions as the differential input of the voltage-swing detection circuit; and the differential output of the second differential amplifier functions as the output of the frequency generator.

15. The frequency generator according to claim 14, wherein:

a band-pass filter having a highest frequency bandpass characteristic equal to a double harmonic of the frequency of the differential signals output from the oscillator is provided between an output of each of the load circuits and a pair of differential inputs of the first and second differential amplifiers.

16. A frequency generator, comprising:

an oscillator that outputs differential signals which can control an oscillation frequency; and a frequency doubler to which differential signals output from the oscillator are input, which doubles a frequency of each input signal, and which outputs differential output signals, wherein:

the frequency doubler comprises:

a variable delay circuit;

a Gilbert-type multiplier that is provided with first differential input terminals to which differential output signals of the oscillator are input via the variable delay circuit and second differential input terminals to which differential output signals of the oscillator are input, and that outputs currents acquired by multiplying input signals;

load circuits which are provided with a highest frequency bandpass characteristic equal to a double harmonic of the frequency of the oscillator, and which convert the output currents of the Gilbert-type multiplier to differential output-voltage signals;

a DC decoupling circuit to which the differential output-voltage signals of the load circuits are input, and which removes DC components therefrom;

a voltage-swing detection circuit to which differential outputs of the DC decoupling circuit are input, and which detects each magnitude of an amplitude in a positive phase and an amplitude in a negative phase; and a control circuit that controls a delay time of the variable delay circuit based upon a difference in amplitude between the positive phase and the negative phase detected by the voltage-swing detection circuit; and wherein the differential outputs of the Gilbert-type multiplier are coupled to output terminals of the frequency generator.

17. The frequency generator according to claim 16, wherein:

a band-pass filter provided with a highest filter bandpass characteristic equal to a double harmonic of the frequency of the oscillator is provided between the DC decoupling circuit and the voltage-swing detection circuit; and the voltage-swing detection circuit detects respective magnitude of an amplitude of differential outputs of the band-pass filter.

18. The frequency generator according to claim 1, wherein:

the differential outputs of the differential multiplier are coupled to the differential output terminals of the frequency generator by a differential amplifier.

19. The frequency generator according to claim 16, wherein:

the differential outputs of the Gilbert-type multiplier are coupled to the output terminals of the frequency generator by a differential amplifier.

* * * * *